US009502549B2

United States Patent
Ikoshi et al.

(10) Patent No.: US 9,502,549 B2
(45) Date of Patent: Nov. 22, 2016

(54) NITRIDE SEMICONDUCTOR DEVICE

(71) Applicant: PANASONIC INTELLECTUAL PROPERTY MANAGEMENT CO., LTD., Osaka (JP)

(72) Inventors: Ayanori Ikoshi, Kyoto (JP); Hiroto Yamagiwa, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/887,249

(22) Filed: Oct. 19, 2015

(65) Prior Publication Data

US 2016/0043208 A1   Feb. 11, 2016

Related U.S. Application Data

(63) Continuation of application No. PCT/JP2013/002736, filed on Apr. 23, 2013.

(51) Int. Cl.
*H01L 29/778* (2006.01)
*H01L 29/40* (2006.01)
(Continued)

(52) U.S. Cl.
CPC ......... *H01L 29/778* (2013.01); *H01L 29/0619* (2013.01); *H01L 29/404* (2013.01);
(Continued)

(58) Field of Classification Search
CPC ............... H01L 29/778; H01L 29/404; H01L 29/0619; H01L 29/66462; H01L 29/7786; H01L 29/407; H01L 29/2003; H01L 21/1848; H01L 21/02389; H01L 21/03044; H01L 21/02241; H01L 29/7783

USPC ............ 257/80, 83, 88, 184, 194, 294, 340, 257/508; 438/116, 167, 172, 731
See application file for complete search history.

(56) References Cited

U.S. PATENT DOCUMENTS 7,038,252 B2   5/2006   Saito et al.
7,508,015 B2   3/2009   Saito et al.
(Continued)

FOREIGN PATENT DOCUMENTS

JP     04-125941 A     4/1992
JP    2005-244072 A    9/2005
(Continued)

OTHER PUBLICATIONS

International Search Report and Written Opinion issued in corresponding International Patent Application No. PCT/JP2013/002736, mailed on Jun. 25, 2013; with English translation.

*Primary Examiner* — Jarrett Stark
*Assistant Examiner* — Shahed Ahmed
(74) *Attorney, Agent, or Firm* — McDermott Will & Emery LLP

(57) ABSTRACT

A nitride semiconductor device includes the followings. A semiconductor multilayer structure is above a substrate and includes a first nitride semiconductor layer and a second nitride semiconductor layer. A source electrode, a drain electrode, and a gate electrode are on the semiconductor multilayer structure. A gate wiring line transmits a gate driving signal to gate electrodes. A first shield structure is on the semiconductor multilayer structure between the drain electrode and the gate electrode or between the drain electrode and the gate wiring line in a non-channel region where an actual current path from the drain electrode to the source electrode is not formed in the semiconductor multilayer structure. The first shield structure is a normally-off structure, suppresses a current flowing from the semiconductor multilayer structure, and is set to have a substantially same potential as a potential of the source electrode.

11 Claims, 14 Drawing Sheets

(51) Int. Cl.
*H01L 29/66* (2006.01)
*H01L 29/06* (2006.01)
*H01L 29/20* (2006.01)
*H01L 29/417* (2006.01)

(52) U.S. Cl.
CPC ....... *H01L29/407* (2013.01); *H01L 29/66462* (2013.01); *H01L 29/7786* (2013.01); *H01L 29/2003* (2013.01); *H01L 29/41758* (2013.01)

(56) References Cited

U.S. PATENT DOCUMENTS

| | | | |
|---|---|---|---|
| 7,851,832 B2 | 12/2010 | Takagi | |
| 7,999,289 B2 | 8/2011 | Suzuki et al. | |
| 8,174,051 B2 | 5/2012 | Cao et al. | |
| 8,188,515 B2 | 5/2012 | Machida et al. | |
| 8,399,913 B2 | 3/2013 | Suzuki et al. | |
| 8,476,677 B2 | 7/2013 | Machida et al. | |
| 8,765,554 B2 | 7/2014 | Imada et al. | |
| 8,872,232 B2 | 10/2014 | Imada | |
| 2005/0189559 A1 | 9/2005 | Saito et al. | |
| 2006/0138454 A1 | 6/2006 | Saito et al. | |
| 2007/0228422 A1 | 10/2007 | Suzuki et al. | |
| 2007/0228477 A1 | 10/2007 | Suzuki et al. | |
| 2009/0008678 A1* | 1/2009 | Ando | H01L 29/7787 257/194 |
| 2009/0108357 A1 | 4/2009 | Takagi | |
| 2010/0155780 A1 | 6/2010 | Machida et al. | |
| 2010/0155781 A1 | 6/2010 | Suzuki et al. | |
| 2011/0254056 A1 | 10/2011 | Machida et al. | |
| 2011/0260777 A1 | 10/2011 | Suzuki et al. | |
| 2012/0217546 A1 | 8/2012 | Machida et al. | |
| 2012/0218783 A1 | 8/2012 | Imada | |
| 2012/0220089 A1 | 8/2012 | Imada et al. | |
| 2013/0228788 A1* | 9/2013 | Yamamura | H01L 29/2003 257/76 |
| 2014/0264379 A1* | 9/2014 | Kub | H01L 29/41725 257/77 |

FOREIGN PATENT DOCUMENTS

| | | |
|---|---|---|
| JP | 2007-273795 A | 10/2007 |
| JP | 2009-111016 A | 5/2009 |
| JP | 2010-147387 A | 1/2010 |
| JP | 2011-228398 A | 11/2011 |
| JP | 2012-178416 A | 9/2012 |
| JP | 2012-178464 A | 9/2012 |

\* cited by examiner

NITRIDE SEMICONDUCTOR DEVICE

CROSS REFERENCE TO RELATED APPLICATION

This is a continuation application of PCT Patent Application No. PCT/JP2013/002736 filed on Apr. 23, 2013, designating the United States of America. The entire disclosure of the above-identified application, including the specification, drawings and claims is incorporated herein by reference in its entirety.

FIELD

The present disclosure relates to nitride semiconductor devices, and more particularly to a power transistor used in inverters, power conditioners, power source circuits, and the like.

BACKGROUND

In recent years, Field Effect Transistors (FETs) including gallium nitride (GaN) nitride semiconductor have been actively developed to serve as high-frequency and high-power devices. GaN is mixed with aluminum nitride (AlN), indium nitride (InN), and the like to generate various mixed crystals.

In particular, a heterojunction in a nitride semiconductor has characteristics that spontaneous polarization or piezoelectric polarization causes highly-concentrated carriers (2 Dimensional Electron Gas (2DEG)) on the junction surface even if the nitride semiconductor is undoped. As a result, if an FET comprises nitride semiconductor, the FET is likely to be a depletion-mode (normally-on) transistor and it is difficult to cause the FET to have enhancement-mode (normally-off) properties. However, the most of devices used in present power electronics markets are normally-off devices, and the normally-off devices are highly demanded also for FETs comprising GaN nitride semiconductor.

A normally-off FET can be formed, for example, by digging a gate part to shift a threshold voltage to a positive voltage. It has also be known that an FET is manufactured on a plane (10-12) of a sapphire substrate to prevent polarization of electric field in a crystal growth direction of the nitride semiconductor. Furthermore, a Junction Field Effect Transistor (JFET) in which a p-type GaN layer is provided to a gate part is proposed as a potential structure serving as a normally-off FET (for example, refer to Patent Literature 1). In the JFET structure, piezoelectric polarization occurred on a heterointerface between a channel layer made of undoped GaN and a barrier layer made of AlGaN is cancelled by piezoelectric polarization occurred on a heterointerface between a barrier layer made of AlGaN and a p-type GaN layer. This structure can reduce the concentration of 2DEG in the p-type GaN layer immediately under the gate part. As a result, the normally-off properties can be offered. Furthermore, if a pn junction having a greater built-in potential than that of a Schottky junction is used as a gate, there are advantages that a rising voltage at the gate is increased and a gate leakage current is reduced even if a positive gate voltage is applied.

However, the conventional JFET has a problem that a so-called reverse transfer capacitance (expressed also as a mirror capacitance, a feedback capacitance, $C_{gd}$, or $C_{rss}$) is large. The increase of the reverse transfer capacitance causes serious problems in a power transistor applied with a high drain voltage, such as inhibition of a high-speed operation and damages caused by erroneous turn-on.

In order to suppress the increase of $C_{gd}$, Patent Literature 2 discloses, for example, that a Schottky electrode having a source potential is provided between a gate electrode and a drain electrode of a GaN FET to prevent coupling of capacitance ($C_{gd}$) between the gate electrode and the drain electrode.

CITATION LIST

Patent Literature

[Patent Literature 1] Japanese Unexamined Patent Application Publication No. 2005-244072
[Patent Literature 2] U.S. Pat. No. 8,174,051

SUMMARY

Technical Problem

Although the GaN FET as disclosed in Patent Literature 2 can reduce $C_{gd}$, there are following problems.

Patent Literature 2 discloses, for example, a method of forming a Schottky electrode having a source potential to be located between a gate electrode and a drain electrode, and a method of arranging the Schottky electrode having the source potential to surround the drain electrode. However, since the FET is not normally-off type but normally-on type, there is 2DEG (channel) which allows a leakage current ($I_{dg}$) flowing from the drain electrode to reach the gate through the 2DEG (channel). Furthermore, regarding a Schottky electrode having a source potential, it is difficult to suppress a so-called a surface leakage current ($I_{ds}$), which flows from the drain electrode and passes through the interface between AlGaN of the Schottky electrode having a potential of the source and a protective film. Therefore, it is difficult to ensure a reliability when a high voltage is applied.

In order to solve the above problems, the present disclosure provides a nitride semiconductor device capable of reducing (a) a leakage current ($I_{dg}$) between a drain electrode and a gate electrode, (b) a leakage current ($I_{ds}$) between the drain electrode and a source electrode, and (c) a gate-drain capacitance ($C_{gd}$), thereby operating a power transistor at a high speed without errors, and ensuring a high reliability even if a high voltage is applied.

Solution to Problem

In accordance with an aspect of the present disclosure for solving the above problems, there is provided a nitride semiconductor device including: a substrate; a semiconductor multilayer structure including a first nitride semiconductor layer and a second nitride semiconductor layer, the first nitride semiconductor layer being above the substrate, and the second nitride semiconductor layer being on the first nitride semiconductor layer and having a greater band gap than a band gap of the first nitride semiconductor layer; a source electrode and a drain electrode arranged at a distance from each other on the semiconductor multilayer structure; a gate electrode disposed between the source electrode and the drain electrode, at a distance from the source electrode and the drain electrode; and a gate wiring line that transmits a gate driving signal to one or more gate electrodes including the gate electrode, wherein the nitride semiconductor device includes in planar view of the substrate: a channel region in which an actual current path from the drain electrode to the source electrode is formed in the semiconductor multilayer structure when a voltage equal to or higher than a threshold voltage is applied between the gate electrode and the source electrode; and a non-channel region in which the actual current path from the drain electrode to the source electrode is not formed in the semiconductor multilayer structure, and the nitride semiconductor device further includes a first shield structure on the semiconductor multilayer structure between the drain electrode and the gate electrode in the non-channel region or between the drain electrode and the gate wiring line in the non-channel region, wherein the first shield structure causes the semiconductor multilayer structure under the first shield structure to have normally-off properties, suppresses a current flowing from the semiconductor multilayer structure, and is set to have a substantially same potential as a potential of the source electrode.

With the above structure, when the drain electrode is applied with a high voltage, the normally-off first shield structure in the non-channel region can reduce a leakage current (Idg) flowing from the drain electrode to the gate electrode through 2DEG (channel). As a result, it is possible to reduce a leakage current in the entire nitride semiconductor device. Furthermore, since the first shield structure is a normally-off structure, regardless of a voltage at the drain voltage (for example, a voltage equal to or lower than a pinch-off voltage), the normally-off first shield structure can block coupling of capacitance (Cgd) from the drain electrode to the gate electrode or the gate wiring line through 2DEG (channel). As a result, it is possible to reduce Cdg in the entire nitride semiconductor device. It is also possible to reduce a leakage current (Ids) flowing between the drain electrode and the source electrode or between the drain electrode and the first shield structure.

For example, it is also possible that the first shield structure has a rectification structure for blocking the current flowing from the semiconductor multilayer structure.

For example, it is further possible that the first shield structure is disposed in and above a recess in the second nitride semiconductor layer.

For example, it is still further possible that the first shield structure includes: a first electrode disposed on the second nitride semiconductor layer; and a p-type semiconductor layer disposed on the second nitride semiconductor layer and being Schottky-connected to a side of the first electrode.

For example, it is still further possible that the first shield structure includes: a p-type semiconductor layer disposed in and above a recess in the second nitride semiconductor layer; and a first electrode disposed on the p-type semiconductor layer.

For example, it is still further possible that the first shield structure includes: an insulating film disposed in and above a recess in the second nitride semiconductor layer; and a first electrode disposed on the insulating film.

These structures can reduce, in the non-channel region, (a) a leakage current (Idg) flowing between the drain electrode and the gate electrode, (b) a leakage current (Ids) flowing between the drain electrode and the source electrode or between the drain electrode and the first shield structure, and (c) Cgd.

For example, it is still further possible that the nitride semiconductor device further includes a second shield structure on the semiconductor multilayer structure between the drain electrode and the gate electrode in the channel region, wherein the second shield structure causes the semiconductor multilayer structure under the second shield structure to have normally-on properties, suppresses the current flowing from the semiconductor multilayer structure, and is set to have a substantially same potential as a potential of the source electrode.

This structure can also reduce, in the channel region, (a) a leakage current (Idg) flowing between the drain electrode and the gate electrode, (b) a leakage current (Ids) flowing between the drain electrode and the source electrode or between the drain electrode and the second shield structure, and (c) Cgd.

For example, it is still further possible that the second shield structure has a discontinuous shape.

This structure can suppress decrease in carrier concentration of 2DEG (channel) in a part not having the second shield structure in the channel region. As a result, it is possible to suppress the increase of on-resistance of a transistor.

For example, it is still further possible that the second shield structure includes one of three structures: (1) a first structure in which a second electrode is disposed on the second nitride semiconductor layer, (2) a second structure in which a p-type semiconductor layer is disposed on the second nitride semiconductor layer and a third electrode is disposed on the p-type semiconductor layer, and (3) a third structure in which an insulating film is disposed on the second nitride semiconductor layer and a fourth electrode is disposed on the insulating film.

For example, it is still further possible that the nitride semiconductor device further includes a third shield structure disposed on the semiconductor multilayer structure between the second shield structure and the drain electrode, wherein the third shield structure causes the semiconductor multilayer structure under the third shield structure to have normally-on properties, suppresses the current flowing from the semiconductor multilayer structure, and is set to have a substantially same potential as a potential of the source electrode, and the third shield structure is one of the first structure, the second structure, and the third structure, and is different from the structure of the second shield structure.

This structure can reduce, in the channel region, (a) a leakage current (Idg) flowing between the drain electrode and the gate electrode, (b) a leakage current (Ids) flowing between the drain electrode and the source electrode or between the drain electrode and the third shield structure, (c) Cgd, and also (d) a forward voltage Vf in a reverse conducting operation in which a current flows from the source electrode to the drain electrode.

For example, it is still further possible that the third shield structure has a discontinuous shape This structure can suppress decrease in carrier concentration of 2DEG (channel) in a part not having the third shield structure in the channel region. As a result, it is possible to suppress the increase of on-resistance of a transistor.

Advantageous Effects

The nitride semiconductor device according to the present disclosure is capable of reducing (a) a leakage current (Idg) between a drain electrode and a gate electrode, (b) a leakage current (Ids) between the drain electrode and a source electrode, and (c) a parasitic capacitance (Cgd) between the gate electrode and the drain electrode, thereby operating at a high speed without errors and ensuring a high reliability even if a high voltage is applied.

BRIEF DESCRIPTION OF DRAWINGS

These and other objects, advantages and features of the present disclosure will become apparent from the following description thereof taken in conjunction with the accompanying drawings that illustrate specific embodiments of the present disclosure.

Figure 1A:
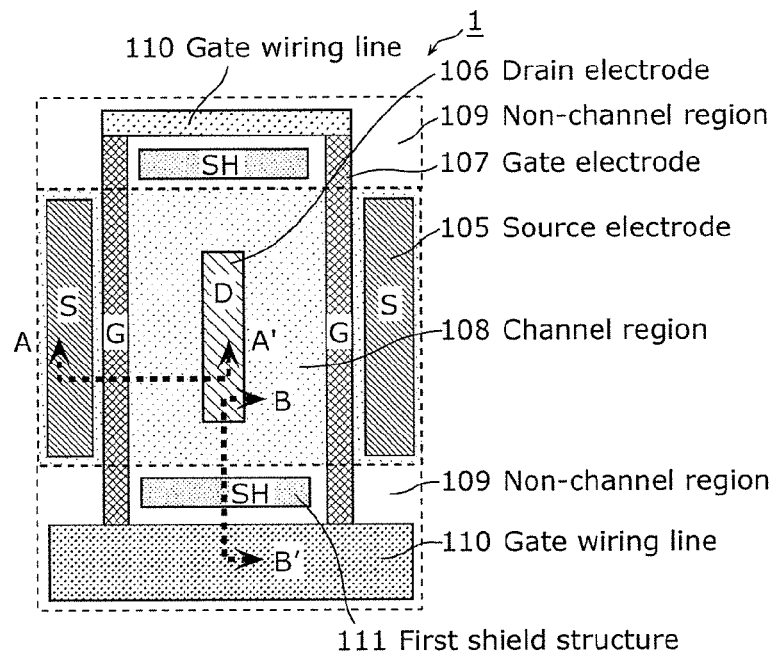
FIG. 1A is a chip plan view of a nitride semiconductor device according to Embodiment 1.

DESCRIPTION OF EMBODIMENTS (Observation Based on which Present Disclosure is Conceived)

The inventors of the present disclosure manufactured the conventional JFET described in the "Background" and found that the conventional JFET had a problem that so-called reverse transfer capacitance (expressed also as a mirror capacitance, a feedback capacitance, $C_{gd}$, or $C_{rss}$) was large. More specifically, for example, when a capacitance was measured while a drain voltage of approximately 100 V was being applied, the reverse transfer capacitance was larger by several pF to dozens of pF than a reverse transfer capacitance (generally, several pF) of a silicon high breakdown voltage power device, such as a Metal Oxide Semiconductor Field Effect Transistor (MOSFET). The increase of $C_{gd}$ causes serious problems in a power transistor applied with a high drain voltage, such as inhibition of a high-speed operation and damages caused by erroneous turn-on.

In general, an erroneous turn-on phenomenon (self turn-on phenomenon), which would be caused by a large amount of $C_{gd}$, is caused by, for example, provision of a bridge circuit in an inverter, a power source circuit, or the like. Regarding the mechanism, the erroneous turn-on phenomenon occurs in the following order of (1) to (5).

(1) A high-side FET is turned on.

(2) A voltage with a large voltage change rate (dV/dt) is applied to a low-side FET.

(3) A displacement current flows to a gate-drain capacitor ($C_{gd}$) and a gate-source capacitor ($C_{gs}$) of the low-side FET.

(4) $C_{gs}$ of the low-side FET is charged by the displacement current.

(5) Gate-source voltage $V_{gs}>V_{th}$, thereby turning on the low-side FET.

In order to suppress the increase of $C_{gd}$, for example, the GaN FET disclosed in Patent Literature 2 has a structure in which a Schottky electrode having a source potential is provided between a gate electrode and a drain electrode to inhibit coupling of capacitance between the gate electrode and the drain electrode. However, although the GaN FET disclosed in Patent Literature 2 can reduce $C_{gd}$, the GaN FET has the following problems.

Since the GaN FET disclosed in Patent Literature 2 is not normally-off type but normally-on type, the GaN FET has 2DEG (channel) that allows a leakage current ($I_{dg}$) flowing from the drain electrode and passing through the 2DEG (channel) to reach the gate. Furthermore, the provision of the Schottky electrode having the source potential is not sufficient to suppress a so-called surface leakage current ($I_{ds}$) which is a leakage current flowing from the drain electrode and passing through an interface between AlGaN of the Schottky electrode having the source electrode and a protective film. Therefore, it is difficult to ensure a reliability when a high voltage is applied.

In accordance with an aspect of the present disclosure for solving the above problems, there is provided a nitride semiconductor device including: a substrate; a semiconductor multilayer structure including a first nitride semiconductor layer and a second nitride semiconductor layer, the first nitride semiconductor layer being above the substrate, and the second nitride semiconductor layer being on the first nitride semiconductor layer and having a greater band gap than a band gap of the first nitride semiconductor layer; a source electrode and a drain electrode arranged at a distance from each other on the semiconductor multilayer structure; a gate electrode disposed between the source electrode and the drain electrode, at a distance from the source electrode and the drain electrode; and a gate wiring line that transmits a gate driving signal to one or more gate electrodes including the gate electrode, wherein the nitride semiconductor device includes in planar view of the substrate: a channel region in which an actual current path from the drain electrode to the source electrode is formed in the semiconductor multilayer structure when a voltage equal to or higher than a threshold voltage is applied between the gate electrode and the source electrode; and a non-channel region in which the actual current path from the drain electrode to the source electrode is not formed in the semiconductor multilayer structure, and the nitride semiconductor device further comprises a first shield structure on the semiconductor multilayer structure between the drain electrode and the gate electrode in the non-channel region or between the drain electrode and the gate wiring line in the non-channel region, wherein the first shield structure causes the semiconductor multilayer structure under the first shield structure to have normally-off properties, suppresses a current flowing from the semiconductor multilayer structure, and is set to have a substantially same potential as a potential of the source electrode.

Embodiment 1

Figure 1B:
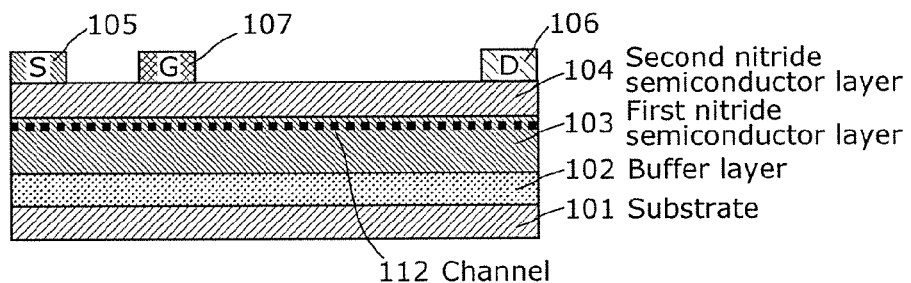
FIG. 1B is a cross-sectional view of a part taken along line A-A' of FIG. 1A.
Figure 1C:
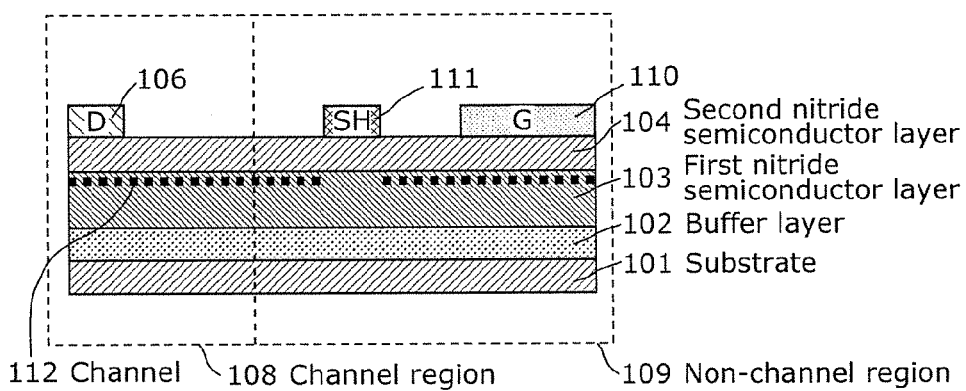
FIG. 1C is a cross-sectional view of a part taken along line B-B' of FIG. 1A.

The following describes Embodiment 1 with reference to the drawings. FIG. 1A is a chip plan view of a nitride semiconductor device according to Embodiment 1. FIG. 1B is a cross-sectional view of a part taken along line A-A' of FIG. 1A. FIG. 1C is a cross-sectional view of a part taken along line B-B' of FIG. 1A.

The nitride semiconductor device 1 according to the present embodiment includes: a substrate 101 comprising silicon; a buffer layer 102 disposed above the substrate 101; a first nitride semiconductor layer 103 disposed above the buffer layer 102, having a thickness ranging from 1 μm to 2 μm, and comprising undoped GaN; and a second nitride semiconductor layer 104 disposed on the first nitride semiconductor layer 103, having a thickness of approximately 50 nm, and comprising undoped AlGaN. Here, the "undoped" means that dopant is not intentionally added. The second nitride semiconductor layer 104 has a greater band gap than a band gap of the first nitride semiconductor layer 103. The first nitride semiconductor layer 103 and the second nitride semiconductor layer 104 form a semiconductor multilayer structure. The nitride semiconductor device 1 also includes a source electrode 105 and a drain electrode 106. The source electrode and the drain electrode are arranged at a distance from each other above the semiconductor multilayer structure. The nitride semiconductor device 1 further includes one or more gate electrodes 107 each of which is provided between a source electrode 105 and a drain electrode 106, at a distance from the source electrode 105 and the drain electrode 106. The nitride semiconductor device 1 still further includes gate wiring lines 110 each of which transmits a gate driving signal to the gate electrode(s) 107.

In an element layout of the substrate 101 in planar view, the nitride semiconductor device 1 according to the present embodiment is divided into: a channel region 108 that is an actual current path; and a non-channel region 109 that is not an actual current path. The channel region 108 is mainly a region in which on-resistance and a withstand voltage of the nitride semiconductor device 1 are dominantly determined. The non-channel region 109 means a region in which on-resistance and a withstand voltage of the nitride semiconductor device 1 are not dominantly determined. In other words, the channel region 108 is defined as a region in which an actual current path from the drain electrode 106 to the source electrode 105 is formed in the semiconductor multilayer structure when a voltage equal to or higher than a threshold voltage is applied between the gate electrode 107 and the source electrode 105. On the other hand, the non-channel region 109 is defined as a region in which an actual current path from the drain electrode 106 to the source electrode 105 is not formed in the semiconductor multilayer structure.

The nitride semiconductor device 1 further includes a first shield structure 111 which is provided on the semiconductor multilayer structure between a drain electrode 106 and a gate electrode 107 in the non-channel region 109, or provided on the semiconductor multilayer structure between a drain electrode 106 and a gate wiring line 110 in the non-channel region 109.

In the channel region 108, the gate electrodes 107, each of which includes at least one of metals, such as titanium (Ti), aluminum (Al), nickel (Ni), platinum (Pt), palladium (Pd), gold (Au), molybdenum (Mo), and hafnium (Hf), are provided on the second nitride semiconductor layer 104. Each gate electrode 107 is in Schottky-contact with the second nitride semiconductor layer 104. It should be noted that the gate structure of the gate electrode 107 is not limited to the Schottky contact. It is also possible to use a p-type semiconductor layer and an electrode material which is in ohmic-contact with the p-type semiconductor layer, such as palladium (Pd). It is also possible to use a Metal Insulator Semiconductor (MIS) structure including an insulating film. It is further possible that a recess is formed in the second nitride semiconductor layer 104 immediately under the gate electrode 107. The gate electrode 107 is provided between the source electrode 105 and the drain electrode 106. Each of the source electrode 105 and the drain electrode 106 has, for example, a multilayer structure including at least one of metals, such as Ti, Al, Mo, and Hf.

Next, in the non-channel region 109, above the second nitride semiconductor layer 104, the gate wiring line 110, which includes at least one of metals, such as Ti, Al, Ni, Pt, Pd, Au, Mo, and Hf, is provided to be connected to the gate electrodes 107.

Each first shield structure 111 is a normally-off structure. The first shield structure 111 is provided between a drain electrode 106 and a gate electrode 107, or between a drain electrode 106 and a gate wiring line 110. The first shield structure 111 is connected to a source electrode 105 to have the substantially same potential as a potential of the source electrode 105 (source potential). Here, in the present embodiment, the "normally-off" means that the channel 112 (2DEG) is not formed. In other words, the first shield structure 111 has a structure causing a part of the semiconductor multilayer structure which is under the first shield structure 111 to have normally-off properties. The first shield structure 111 suppresses a current flowing from the semiconductor multilayer structure, and thereby has the substantially same potential as that of the source electrode 105.

This structure can reduce a leakage current (Idg) flowing between the drain electrode 106 and the gate wiring line 110 through the channel 112 or a leakage current (Ids) flowing between the drain electrode 106 and the source electrode 105 or between the drain electrode 106 and the first shield structure 111 having the source potential. Furthermore, the provision of the first shield structure 111 can reduce gate-drain capacitance Cgd coupled between the gate wiring line 110 and the drain electrode 106 through the channel 112. Thereby, the nitride semiconductor device 1 according to the present embodiment is capable of operating at a high speed without errors, and ensuring a high reliability even when a high voltage is applied. Furthermore, the first shield structure 111 is provided not in the channel region 108 including the source electrode 105 and the drain electrode 106, but in the non-channel region 109. Therefore, without increasing on-resistance, it is possible to reduce (a) the leakage current (Idg) between the drain electrode 106 and the gate electrode 107, (b) the leakage current (Ids) flowing between the drain electrode 106 and the source electrode 105 or between the drain electrode 106 and the first shield structure 111, and (c) Cgd.

Here, the structure in which the first shield structure 111 is connected to the source electrode 105 to have the "substantially" same potential as the potential of the source electrode 105 is not limited to the structure in which the first shield structure 111 is electrically connected directly to the source electrode 105. The above structure may include the other structures, for example, a structure in which a potential of the first shield structure 111 is set to be lower than a potential of the drain electrode 106 so that there is a difference between the potential of the drain electrode 106 and the potential of the first shield structure 111.

In the present embodiment, the normally-off first shield structure 111 having a source potential may have the following structures.

Figure 2:
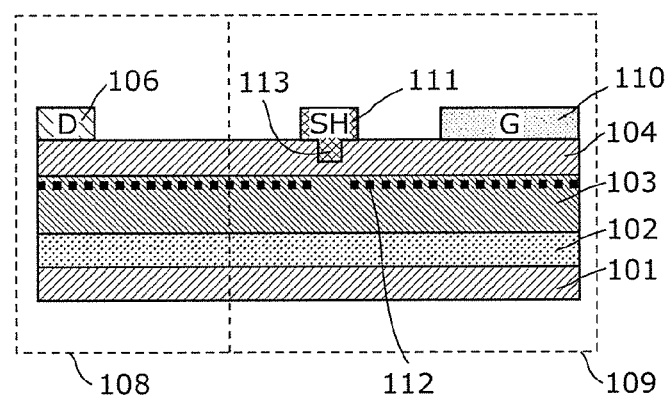
FIG. 2 is a cross-sectional view of a nitride semiconductor device having a first shield structure according to Variation 1 of Embodiment 1.

FIG. 2 is a cross-sectional view of a nitride semiconductor device having a first shield structure according to Variation 1 of Embodiment 1. As illustrated in FIG. 2, the second nitride semiconductor layer 104 has a recess 113 in and above which the first shield structure 111 is provided to produce normally-off properties.

In the present variation, for example, the first shield structure 111 includes at least one of metals, such as Ti, Al, Ni, Pt, Pd, Au, Mo, and Hf, and is in Schottky-contact with the second nitride semiconductor layer 104. In this example, the first shield structure 111 is in Schottky-contact with the second nitride semiconductor layer 104. Therefore, this Schottky diode can lower a forward voltage Vf in a reverse conducting operation in which, for example, a current flows from the source electrode 105 to the drain electrode 106. The material of the electrode serving as the first shield structure 111 is not limited to nickel (Ni), but may be any metal causing a Schottky barrier height ϕb (ϕb=ϕm−x, where ϕm is a work function of metal, and X is electron affinity) to be positive. The normally-off properties can be produced by appropriately controlling a thickness and a doping concentration (for example, Al composition) of the part of the second nitride semiconductor layer 104 which is immediately under the recess 113. Generally, a threshold voltage at a transistor having 2DEG on a heterojunction can be expressed by the following equations.

[Math. 1]
$$Vth = \phi_b - \frac{\Delta Ec}{q} - V_p \quad \text{(Equation 1)}$$

[Math. 2]
$$V_p = \frac{q}{\varepsilon}\int_0^d N_D(x)x\,dx = \frac{qN_D d^2}{2\varepsilon s} \quad \text{(Equation 2)}$$

where q is elementary charge, $N_D$ is donor concentration, d is a thickness of the second nitride semiconductor layer 104, εs is relative permittivity, ϕb is a barrier height of a metal or other semiconductor layer on the second nitride semiconductor layer 104, ΔEc is band discontinuity between the second nitride semiconductor layer 104 and the first nitride semiconductor layer 103, and Vp is a pinch-off voltage.

According to the above equations, since the pinch-off voltage Vp is proportional to a square of the thickness of the second nitride semiconductor layer 104, adjustment of the thickness is the most effective to produce normally-off properties. More specifically, in the present embodiment, in order to set a threshold voltage to 0 V or higher, for example, a thickness of a part of the second nitride semiconductor layer 104 which is immediately under the recess 113 is set to approximately 10 nm, a thickness of the other part of the second nitride semiconductor layer 104 is set to approximately 25 nm, and Al composition is set to approximately 20%, thereby producing normally-off properties. The width of the recess 113 ranges, for example, from approximately 1 μm to approximately 2 μm. Furthermore, if the second nitride semiconductor layer 104 is thin, for example, having a thickness of approximately 10 nm, enough to cause the nitride semiconductor device 1 to be a normally-on device or a normally-off device, it is not necessary to provide the recess 113.

In other words, the nitride semiconductor device 1 according to Variation 1 includes the first shield structure 111 that has a rectification structure for blocking a current flowing from the semiconductor multilayer structure and that is provided in and above the recess 113 formed in the second nitride semiconductor layer 104.

The structure according to Variation 1 described above can reduce (a) a leakage current (Idg) flowing between the drain electrode 106 and the gate wiring line 110 through the channel 112, and (b) a leakage current (Ids) flowing between the drain electrode 106 and the source electrode 105 or between the drain electrode 106 and the first shield structure 111 having a source potential. Furthermore, the provision of the first shield structure 111 blocks coupling of Cgd between the gate wiring line 110 and the drain electrode 106 through the channel 112, thereby reducing Cgd. Therefore, the nitride semiconductor device 1 is capable of operating at a high speed without errors, and ensuring a high reliability even when a high voltage is applied. Furthermore, since the first shield structure 111 is provided in the non-channel region 109, not in the channel region 108 provided with the source electrode 105 and the drain electrode 106, it is possible to reduce the leakage current (Idg) between the drain electrode 106 and the gate electrode 107, and also the Cgd, without increasing on-resistance.

Figure 3:
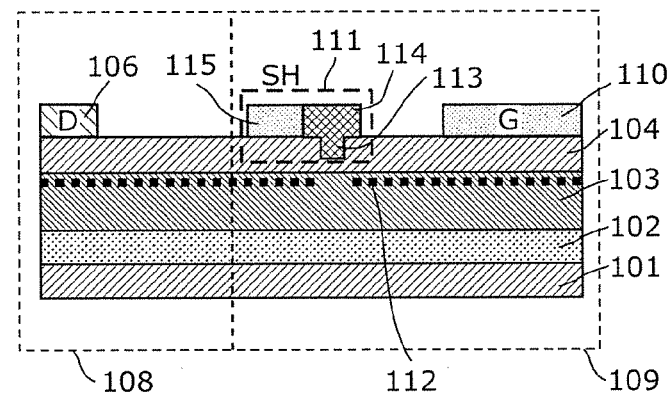
FIG. 3 is a cross-sectional view of a nitride semiconductor device having a first shield structure according to Variation 2 of Embodiment 1.

FIG. 3 is a cross-sectional view of a nitride semiconductor device having a first shield structure according to Variation 2 of Embodiment 1. As illustrated in FIG. 3, the second nitride semiconductor layer 104 has a recess 113. Furthermore, a p-type semiconductor layer 115 is provided close to the recess 113 and on the second nitride semiconductor layer 104. In addition, a first electrode 114 is provided in and above the recess 113. Here, the second nitride semiconductor layer 104 and the p-type semiconductor layer 115 are in contact with the first electrode 114. The above-described structure forms the first shield structure 111 to produce normally-off properties.

In the present variation, for example, the first electrode 114 includes at least one of metals, such as Ti, Al, Ni, Pt, Pd, Au, Mo, and Hf, and is in Schottky-contact with the second nitride semiconductor layer 104. The Schottky contact can lower a forward voltage Vf in a reverse conducting operation in which, for example, a current flows from the source electrode 105 to the drain electrode 106. The material of the first electrode 114 is not limited to nickel (Ni), but may be any metal causing a Schottky barrier height ϕb (ϕb=ϕm−x, where ϕm is a work function of metal, and X is electron affinity) to be positive. The width of the recess 113 ranges, for example, from approximately 1 μm to approximately 2 μm.

The p-type semiconductor layer 115 may comprise at least one of Si, GaN, AlGaN, AlN, InN, InAlN, InGaN, InAlGaN, NiO, $FeO_2$, $CoO_2$, MnO, CuO, ZnO, $In_2O_3$, $SnO_2$, $Y_2O_3$, $SrTiO_3$, $SrPbO_3$, and $TiO_2$. Furthermore, the material of the p-type dopant is, for example, magnesium (Mg) having concentration of approximately $1\times10^{-18}$ $cm^{-3}$ to approximately $1\times10^{-21}$ $cm^{-3}$. The thickness of the p-type semiconductor layer 115 ranges, for example, from approximately nm to approximately 300 nm, and more desirably from approximately 150 nm to approximately 250 nm. The width of the p-type semiconductor layer 115 may range from approximately 1 μm to approximately 3 μm depending on a distance between the drain electrode 106 and the gate wiring line 110. The p-type semiconductor layer 115 may be provided on only one side of the first electrode 114 to face the drain electrode 106, or provided on both sides of the first electrode 114 and close to the recess 113 so that one of the p-type semiconductor layers 115 faces the drain electrode 106 and the other faces the gate wiring line 110. Furthermore, if the second nitride semiconductor layer 104 is thin, for example, having a thickness of approximately 10 nm, enough to cause the nitride semiconductor device to be a normally-on device or a normally-off device, it is not necessary to provide the recess 113.

In other words, the first shield structure 111 according to Variation 2 includes: the first electrode 114 provided on the second nitride semiconductor layer 104; and the p-type semiconductor layer 115 that is provided on the second nitride semiconductor layer 104 and Schottky-connected to the side of the first electrode 114.

With the above structure, the nitride semiconductor device according to Variation 2 can produce the same effects as the effects of the nitride semiconductor device according to Variation 1 illustrated in FIG. 2. In other words, the provision of the p-type semiconductor layer 115 can easily expand a depletion layer in the p-type semiconductor layer 115, the first nitride semiconductor layer 103, and the second nitride semiconductor layer 104. This structure can reduce (a) a leakage current (Idg) flowing between the drain electrode 106 and the gate wiring line 110 through the surface of the second nitride semiconductor layer 104, (b) a leakage current (Idg) flowing between the drain electrode 106 and the gate wiring line 110 through the channel 112, and (c) a leakage current (Ids) flowing between the drain electrode 106 and the source electrode 105 or between the drain electrode 106 and the first shield structure 111 having a source potential. Furthermore, the provision of the first shield structure 111 blocks coupling of Cgd between the gate wiring line 110 and the drain electrode 106 through the channel 112, thereby reducing Cgd. Therefore, the nitride semiconductor device 1 is capable of operating at a high speed without errors, and ensuring a high reliability even when a high voltage is applied. Furthermore, since the first shield structure 111 is provided in the non-channel region 109, not in the channel region 108 provided with the source electrode 105 and the drain electrode 106, it is possible to reduce the leakage current (Idg) between the drain electrode 106 and the gate electrode 107 and also the Cgd, without increasing on-resistance.

Figure 4:
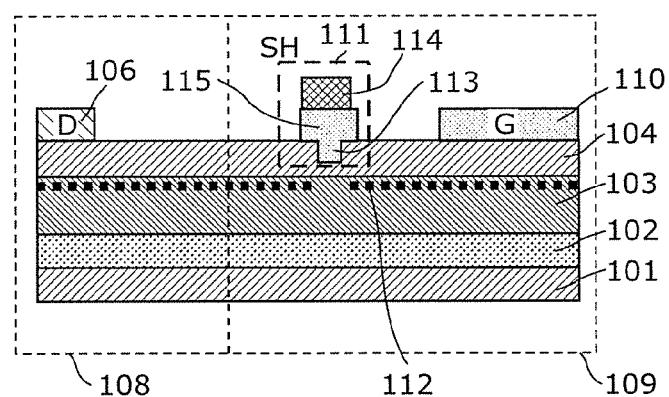
FIG. 4 is a cross-sectional view of a nitride semiconductor device having a first shield structure according to Variation 3 of Embodiment 1.

FIG. 4 is a cross-sectional view of a nitride semiconductor device having a first shield structure according to Variation 3 of Embodiment 1. As illustrated in FIG. 4, the second nitride semiconductor layer 104 has a recess 113. Furthermore, a p-type semiconductor layer 115 is provided in and above the recess 113, and a first electrode 114 is provided on the p-type semiconductor layer 115. The above-described structure forms the first shield structure 111 to produce normally-off properties.

In the present variation, for example, the first electrode 114 comprises a material, such as nickel (Ni), and be in Schottky-contact with the p-type semiconductor layer 115. It is also possible that, for example, the first electrode 114 comprises a material, such as palladium (Pd), and is in ohmic-contact with the p-type semiconductor layer 115. The width of the recess 113 ranges, for example, from approximately 1 μm to approximately 2 μm.

The p-type semiconductor layer 115 may comprise at least one of Si, GaN, AlGaN, AlN, InN, InAlN, InGaN, InAlGaN, NiO, $FeO_2$, $CoO_2$, MnO, CuO, ZnO, $In_2O_3$, $SnO_2$, $Y_2O_3$, $SrTiO_3$, $SrPbO_3$, and $TiO_2$. Furthermore, the material of the p-type dopant is, for example, magnesium (Mg) having concentration of approximately $1\times10^{-18}$ $cm^{-3}$ to approximately $1\times10^{-21}$ $cm^{-3}$. The thickness of the p-type semiconductor layer 115 ranges, for example, from approximately nm to approximately 300 nm, and more desirably from approximately 150 nm to approximately 250 nm. The width of the p-type semiconductor layer 115 ranges, for example, from approximately 1 μm to approximately 3 μm depending on a distance between the drain electrode 106 and the gate wiring line 110. Furthermore, if the second nitride semiconductor layer 104 is thin, for example, having a thickness of approximately 10 nm, enough to cause the nitride semiconductor device to be a normally-on device or a normally-off device, it is not necessary to provide the recess 113.

In other words, the first shield structure 111 according to Variation 3 includes: the p-type semiconductor layer 115 provided in and above the recess 113 formed in the second nitride semiconductor layer 104; and the first electrode 114 provided on the p-type semiconductor layer 115.

With the above structure, the nitride semiconductor device according to Variation 3 can produce the same effects as the effects of the nitride semiconductor devices according to Variations 1 and 2 illustrated in FIGS. 2 and 3. In other words, the provision of the p-type semiconductor layer 115 can easily expand a depletion layer in the p-type semiconductor layer 115, the first nitride semiconductor layer 103, and the second nitride semiconductor layer 104. This structure can reduce (a) a leakage current (Idg) flowing between the drain electrode 106 and the gate wiring line 110 through the surface of the second nitride semiconductor layer 104, (b) a leakage current (Idg) flowing between the drain electrode 106 and the gate wiring line 110 through the channel 112, and (c) a leakage current (Ids) flowing between the drain electrode 106 and the source electrode 105 or between the drain electrode 106 and the first shield structure 111 having a source potential. The conjunction between the p-type semiconductor layer 115 and the second nitride semiconductor layer 104 in the recess 113 can further reduce the leakage current (Idg) flowing between the drain electrode 106 and the gate electrode 107 through the channel 112 in comparison to the structure according to Variation 2 illustrated in FIG. 3. Furthermore, the provision of the first shield structure 111 blocks coupling of Cgd between the gate wiring line 110 and the drain electrode 106 through the channel 112, thereby reducing Cgd. Therefore, the nitride semiconductor device 1 is capable of operating at a high speed without errors, and ensuring a high reliability even when a high voltage is applied. Furthermore, since the first shield structure 111 is provided in the non-channel region 109, not in the channel region 108 provided with the source electrodes 105 and the drain electrode 106, it is possible to reduce the leakage current (Idg) between the drain electrode 106 and the gate electrode 107, and also the Cgd, without increasing on-resistance.

Figure 5:
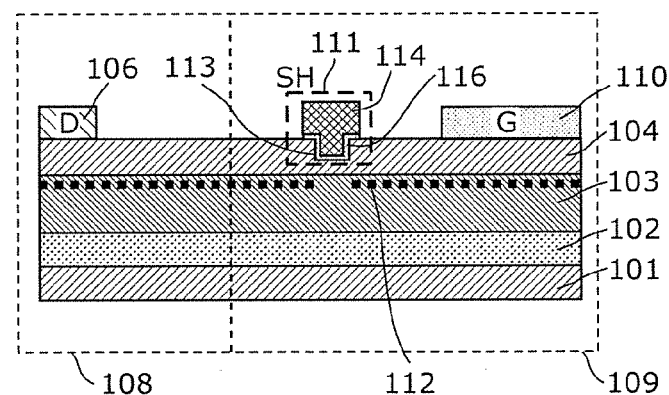
FIG. 5 is a cross-sectional view of a nitride semiconductor device having a first shield structure according to Variation 4 of Embodiment 1.

FIG. 5 is a cross-sectional view of a nitride semiconductor device having a first shield structure according to Variation 4 of Embodiment 1. As illustrated in FIG. 5, the second nitride semiconductor layer 104 has a recess 113. An insulating film 116 is provided in and above the recess 113, and a first electrode 114 is provided on the insulating film 116. The above-described structure forms the first shield structure 111 to produce normally-off properties.

In the present variation, for example, the first electrode 114 includes at least one of metals, such as Ti, Al, Ni, Pt, Pd, Au, Mo, and Hf, and is in contact with the insulating film 116. The width of the recess 113 ranges, for example, from approximately 1 μm to approximately 2 μm.

The insulating film 116 comprises at least one of $SiO_2$, $Si_3N_4$, AlN, $Al_2O_3$, $Ga_2O_3$, MgO, $ZrO_2$, $HfO_2$, and $La_2O_3$. Furthermore, the thickness of the insulating film 116 ranges, for example, from approximately 10 nm to approximately 50 nm, and more desirably approximately 20 nm. The width of the insulating film 116 ranges, for example, from approximately 1 μm to approximately 3 μm depending on a distance between the drain electrode 106 and the gate wiring line 110.

In other words, the first shield structure 111 according to Variation 4 includes: the insulating film 116 provided in and above the recess 113 formed in the second nitride semiconductor layer 104; and the first electrode 114 provided on the insulating film 116.

With the above structure, the nitride semiconductor device according to Variation 4 can produce the same effects as the effects of the nitride semiconductor devices according to Variations 1, 2, 3 illustrated in FIGS. 2, 3, and 4. In other words, the provision of the insulating film 116 can easily expand a depletion layer in the first nitride semiconductor layer 103 and the second nitride semiconductor layer 104. This structure can reduce (a) a leakage current (Idg) flowing between the drain electrode 106 and the gate wiring line 110 through the surface of the second nitride semiconductor layer 104, (b) a leakage current (Idg) flowing between the drain electrode 106 and the gate wiring line 110 through the channel 112, and (c) a leakage current (Ids) flowing between the drain electrode 106 and the source electrode 105 or between the drain electrode 106 and the first shield structure 111 having a source potential. Furthermore, the provision of the first shield structure 111 blocks coupling of Cgd between the gate wiring line 110 and the drain electrode 106 through the channel 112, thereby reducing Cgd. Therefore, the nitride semiconductor device 1 is capable of operating at a high speed without errors, and ensuring a high reliability even when a high voltage is applied. Furthermore, since the first shield structure 111 is provided in the non-channel region 109, not in the channel region 108 provided with the source electrodes 105 and the drain electrode 106, it is possible to reduce the leakage current (Idg) between the drain electrode 106 and the gate electrode 107, and also the Cgd, without increasing on-resistance.

Embodiment 2

The following describes Embodiment 2 with reference to the drawings.

Figure 6A:
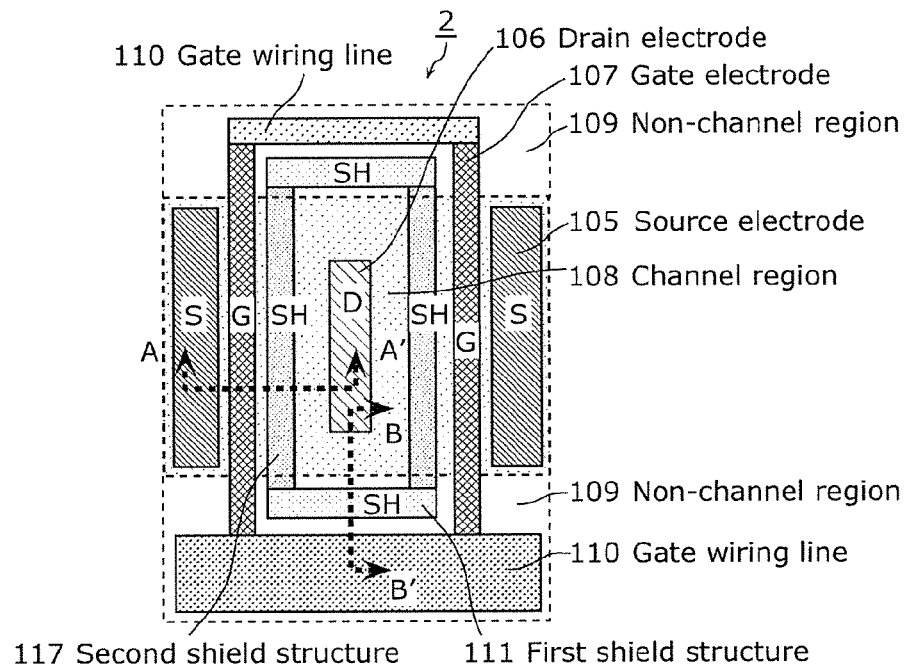
FIG. 6A is a chip plan view of a nitride semiconductor device according to Embodiment 2.
Figure 6B:
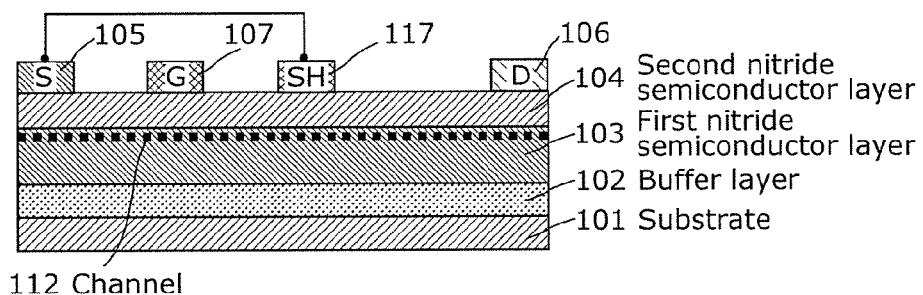
FIG. 6B is a cross-sectional view of a part taken along line A-A' of FIG. 6A.
Figure 6C:
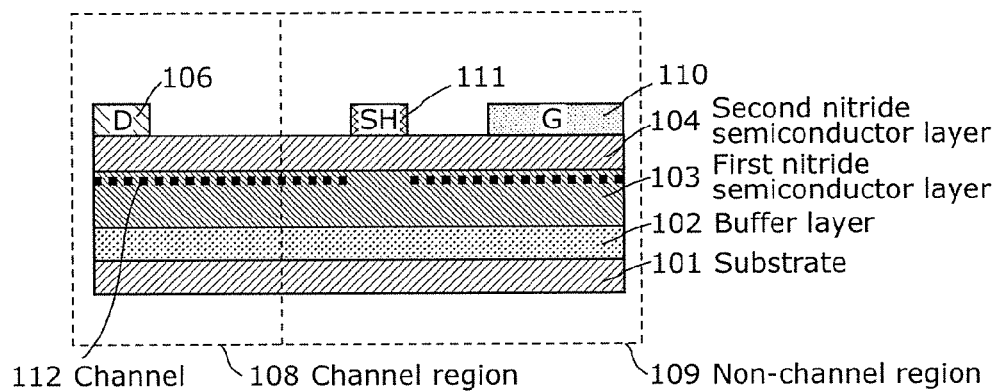
FIG. 6C is a cross-sectional view of a part taken along line B-B' of FIG. 6A.

FIG. 6A is a chip plan view of a nitride semiconductor device according to Embodiment 2. FIG. 6B is a cross-sectional view of a part taken along line A-A' of FIG. 6A. FIG. 6C is a cross-sectional view of a part taken along line B-B' of FIG. 6A.

A nitride semiconductor device 2 according to Embodiment 2 differs from the nitride semiconductor device 1 according to Embodiment 1 in that a second shield structure 117 is further provided. In the following description, the structural elements substantially identical to the structural elements in the nitride semiconductor device 1 according to Embodiment 1 are not described again, and structural elements different from the structural elements in the nitride semiconductor device 1 are mainly described.

The second shield structure 117 is mainly provided between a gate electrode 107 and a drain electrode 106 in the channel region 108, and is connected to the first shield structure 111 in the non-channel region 109. Second shield structure 117 has normally-on properties, and has the substantially same potential as that of the source electrode 105. Here, in the present embodiment, the "normally-on" means that the channel 112 (2DEG) exists. More specifically, since the second shield structure 117 is to have normally-on properties, the normally-on structure can be formed by changing the structure of the normally-off first shield structure 111 as illustrated in FIGS. 2 to 5, for example, by decreasing the depth of the recess in the normally-off first shield structure 111. In other words, the second shield structure 117 has a structure causing a part of the semiconductor multilayer structure which is under the second shield structure 117 to have normally-on properties. The first shield structure 117 suppresses a current flowing from the semiconductor multilayer structure, and thereby has the substantially same potential as that of the source electrode 105.

It is desirable that the first shield structures 111 and the second shield structures 117 continuously surround the drain electrode 106. However, it is also possible that there is a gap between the first shield structure 111 and the second shield structure 117 in the non-channel region 109. This structure can reduce (a) a leakage current (Idg) flowing between the drain electrode 106 and the gate electrode 107 through the channel 112 that appears between the drain electrode 106 and the gate electrode 107, and (b) a leakage current (Ids) flowing between the drain electrode 106 and the source electrode 105 or between the drain electrode 106 and the second shield structure 117 having a source potential. Furthermore, the provision of the second shield structures 117 blocks (c) coupling of Cgd between the gate electrode 107 and the drain electrode 106 through the channel 112, thereby reducing Cgd. Thereby, the nitride semiconductor device 2 according to Embodiment 2 is capable of operating at a high speed without errors, and ensuring a high reliability even when a high voltage is applied.

Figure 7:
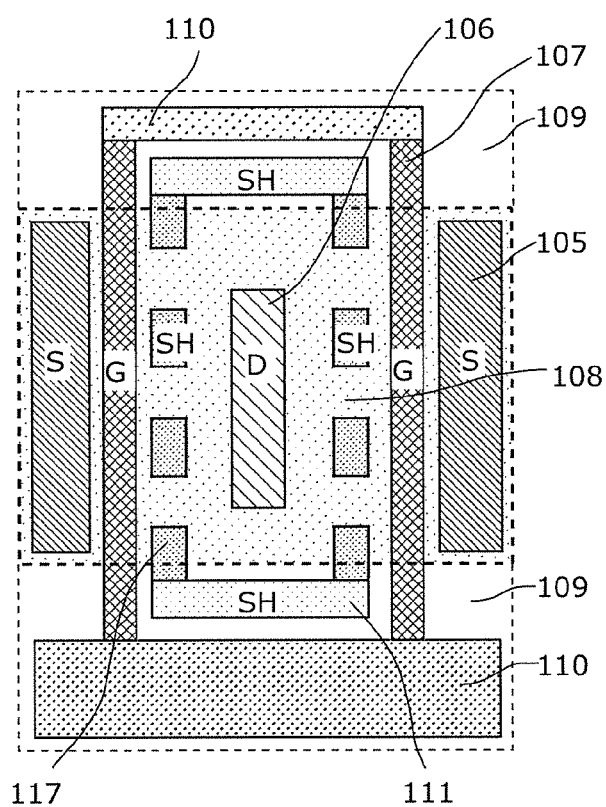
FIG. 7 is a cross-sectional view of a nitride semiconductor device having a second shield structure according to Variation 5 of Embodiment 2.

FIG. 7 is a cross-sectional view of a nitride semiconductor device having a second shield structure according to Variation 5 of Embodiment 2. As illustrated in FIG. 7, the normally-on second shield structure 117 may be discontinuously formed in the channel region 108 (in other words, the normally-on second shield structure 117 may have a discontinuous shape in the channel region 108). This structure can suppress increase of on-resistance without increasing 2DEG sheet resistivity immediately under the second shield structure 117.

In the present embodiment, the normally-on second shield structure 117 may have the following structure.

Figure 8A:
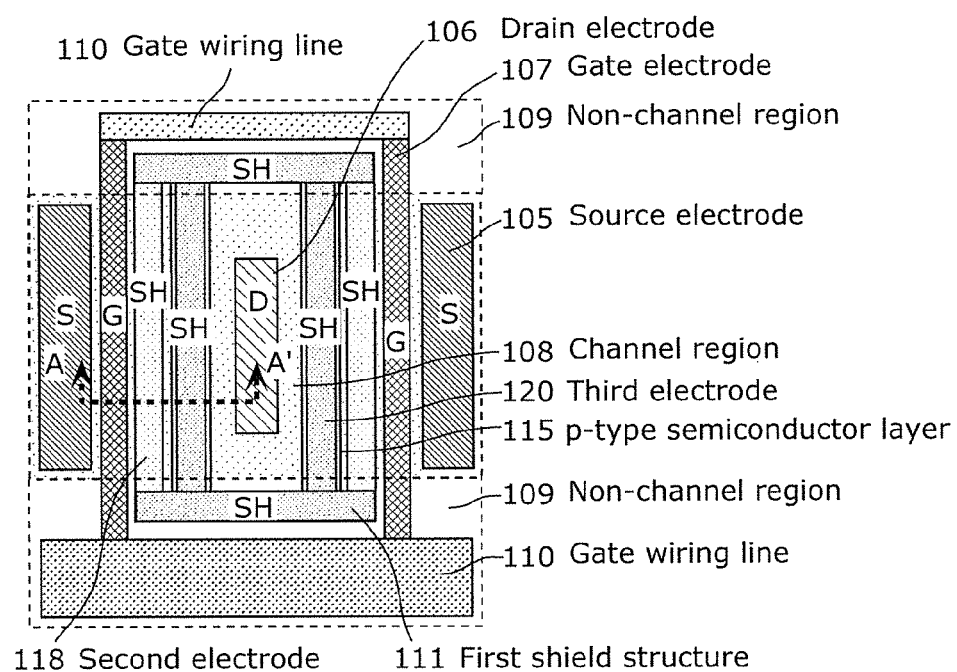
FIG. 8A is a chip plan view of a nitride semiconductor device according to Variation 6 of Embodiment 2.
Figure 8B:
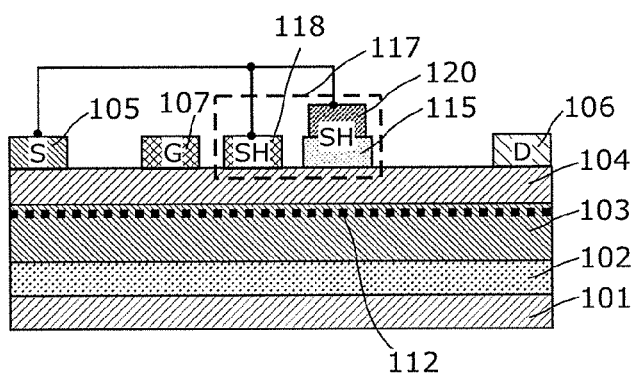
FIG. 8B is a cross-sectional view of a part taken along line A-A' of FIG. 8A.

FIG. 8A is a chip plan view of a nitride semiconductor device according to Variation 6 of Embodiment 2. FIG. 8B is a cross-sectional view of a part taken along line A-A' of FIG. 8A. As illustrated in FIGS. 8A and 8B, a second electrode 118 is provided mainly between a gate electrode 107 and a drain electrode 106 on the second nitride semiconductor layer 104 in the channel region 108. Furthermore, a p-type semiconductor layer 115 is provided between the second electrode 118 and the drain electrode 106 on the second nitride semiconductor layer 104. Moreover, a third electrode 120 is provided on the p-type semiconductor layer 115. The above-described structure forms the second shield structure 117 to produce normally-on properties.

In the present variation, for example, the second electrode 118 includes at least one of metals, such as Ti, Al, Ni, Pt, Pd, Au, Mo, and Hf, and is in Schottky-contact with the second nitride semiconductor layer 104. In this example, the second electrode 118 is in Schottky-contact with the second nitride semiconductor layer 104. Therefore, this Schottky diode can lower a forward voltage Vf in a reverse conducting operation in which, for example, a current flows from the source electrode 105 to the drain electrode 106. The material of the second electrode 118 is not limited to nickel (Ni), but may be any metal causing a Schottky barrier height $\phi b$ ($\phi b = \phi m - x$, where $\phi m$ is a work function of metal, and X is electron affinity) to be positive. In the present variation, for example, the third electrode 120 comprises a material, such as nickel (Ni), and is in Schottky-contact with the p-type semiconductor layer 115. It is also possible that, for example, the third electrode 120 comprises a material, such as palladium (Pd), and is in ohmic-contact with the p-type semiconductor layer 115.

The p-type semiconductor layer 115 may comprise at least one of Si, GaN, AlGaN, AlN, InN, InAlN, InGaN, InAlGaN, NiO, $FeO_2$, $CoO_2$, MnO, CuO, ZnO, $In_2O_3$, $SnO_2$, $Y_2O_3$, $SrTiO_3$, $SrPbO_3$, and $TiO_2$. Furthermore, the material of the p-type dopant is, for example, magnesium (Mg) having concentration of approximately $1\times10^{-18}$ $cm^{-3}$ to approximately $1\times10^{-21}$ $cm^{-3}$. The thickness of the p-type semiconductor layer 115 ranges, for example, from approximately nm to approximately 300 nm, and more desirably from approximately 150 nm to approximately 250 nm. The width of the p-type semiconductor layer 115 ranges, for example, from approximately 1 μm to approximately 3 μm depending on a distance between the drain electrode 106 and the gate wiring line 110. Furthermore, it is also possible that a recess is formed in the second nitride semiconductor layer 104 immediately under the p-type semiconductor layer 115 to produce normally-on properties.

With the above structure, the nitride semiconductor device according to Variation 6 can produce the same effects as the effects of the nitride semiconductor devices according to Variations 1 to 4 illustrated in FIGS. 2 to 5. In other words, the provision of the p-type semiconductor layer 115 also in the channel region 108 can easily expand a depletion layer in the p-type semiconductor layer 115, the first nitride semiconductor layer 103, and the second nitride semiconductor layer 104. This structure can reduce (a) a leakage current (Idg) flowing between the drain electrode 106 and the gate electrode 107 through the surface of the second nitride semiconductor layer 104, and (b) a leakage current (Idg) flowing between the drain electrode 106 and the gate electrode 107 through the channel 112. Furthermore, the provision of the second shield structure 117 blocks coupling of Cgd between the gate electrode 107 and the drain electrode 106 through the channel 112, thereby reducing Cgd. Therefore, the nitride semiconductor device 2 is capable of operating at a high speed without errors, and ensuring a high reliability even when a high voltage is applied. Moreover, a leakage current (Idg) flowing between the drain electrode 106 and the gate electrode 107, which is the problem caused by a Schottky electrode, is solved by the provision of the p-type semiconductor layer 115 that blocks and reduces the leakage current (Idg). In a reverse conducting operation, the second electrode 118, which is in Schottky contact with the second nitride semiconductor layer 104, can reduce a forward voltage Vf in a reverse conducting operation in which a current flows from the source electrode 105 to the drain electrode 106. It is therefore possible to solve the trade-off between (a) the reduction of a leakage current flowing from the gate electrode 107 and the drain electrode 106 and (b) the reduction of a forward voltage Vf in a reverse conducting operation, both of which are caused by a Schottky electrode.

It is also possible, in the shield structure described in Variation 6, that the second electrode 118 corresponds to the second shield structure, that a multilayer structure including the p-type semiconductor layer 115 and the third electrode 120 corresponds to the third shield structure, and that the second shield structure and the third shield structure have the following structures.

In other words, the second shield structure has one of the following three structures: (1) a first structure in which a second electrode is disposed on the second nitride semiconductor layer 104, (2) a second structure in which a p-type semiconductor layer is disposed on the second nitride semiconductor layer 104 and a third electrode is disposed on the p-type semiconductor layer, and (3) a third structure in which an insulating film is disposed on the second nitride semiconductor layer 104 and a fourth electrode is disposed on the insulating film.

Furthermore, the third shield structure is provided on the semiconductor multilayer structure between the second shield structure and the drain electrode. Furthermore, the third shield structure, in which a semiconductor multilayer structure has normally-on properties immediately under the third shield structure, suppresses a current flowing from the semiconductor multilayer structure and has the substantially same potential as a potential of the source electrode. Furthermore, the third shield structure is one of the first structure, the second structure, and the third structure, and is different from the structure of the second shield structure.

If the second shield structure is the first structure and the third shield structure is the third structure, if the second shield structure is the second structure and the third shield structure is the third structure, or if the second shield structure is the third structure and the third shield structure is the second structure, the nitride semiconductor device can reduce a leakage current (Idg) flowing between the drain electrode 106 and the gate electrode 107, and a leakage current (Ids) flowing between drain electrode 106 and the source electrode 105 or between the drain electrode 106 and the shield structure.

Furthermore, if the second shield structure is the first structure and the third shield structure is the second structure, if the second shield structure is the second structure and the third shield structure is the first structure, or if the second shield structure is the third structure and the third shield structure is the first structure, the nitride semiconductor device is capable of reducing not only the leakage current (Idg) and the leakage current (Ids) but also the forward voltage Vf in a reverse conducting operation.

Figure 9:
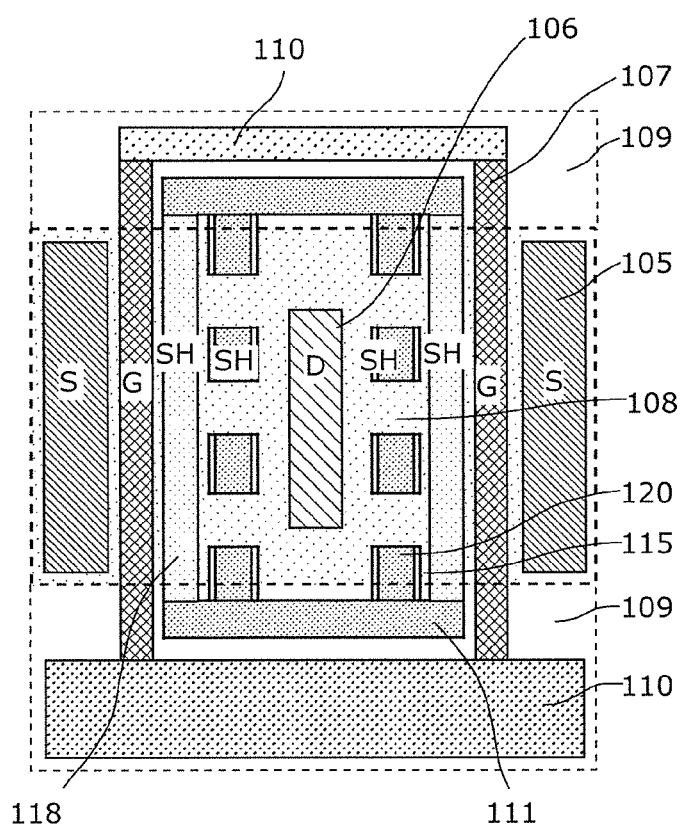
FIG. 9 is a cross-sectional view of a nitride semiconductor device having a second shield structure according to Variation 7 of Embodiment 2.

FIG. 9 is a cross-sectional view of a nitride semiconductor device having a second shield structure according to Variation 7 of Embodiment 2. As illustrated in FIG. 9, the p-type semiconductor layer 115 and the third electrode 120 in the normally-on second shield structure 117 may be discontinuously formed in the channel region 108. This structure can suppress increase of on-resistance without increasing 2DEG sheet resistivity immediately under the p-type semiconductor layer 115.

Embodiment 3

In the present embodiment, methods of manufacturing the nitride semiconductor devices according to Embodiments 1 and 2 are described with reference to the drawings.

Table 1 shows details of steps included in the manufacturing method according to Embodiment 3. Table 2 shows flows of the manufacturing methods corresponding to the respective embodiments and variations. Each of the manufacturing methods according to the embodiments and variations is a method of manufacturing the nitride semiconductor device that includes minimum structural elements described in the corresponding one of the embodiments and variations. Therefore, the present disclosure is not limited to the manufacturing methods or to film-forming methods and manufacturing steps included in each of the manufacturing methods.

TABLE 1

| Step Name | Step Details |
| --- | --- |
| Step (a) | Dispose buffer layer 102 |
| Step (b) | Dispose first nitride semiconductor layer 103 |
| Step (c) | Dispose second nitride semiconductor layer 104 |
| Step (d) | Form source electrode 105 and drain electrode 106 |
| Step (e) | Form gate electrode 107 and gate wiring line 110 |
| Step (f) | Form recess 113 |
| Step (g) | Form first shield structure 111 |
| Step (h) | Dispose p-type semiconductor layer 115 |
| Step (i) | Process p-type semiconductor layer 115 |
| Step (j) | Form first electrode 114 |
| Step (k) | Form insulating film 116 |
| Step (l) | Process insulating film 116 |
| Step (m) | Form second shield structure 117 |
| Step (n) | Process second shield structures 117 (to be discontinuous) |
| Step (o) | Form second electrode 118 |
| Step (p) | Form third electrode 120 |
| Step (r) | Process third electrode 120 | tor, such as sapphire, SiC, Si, or GaN, by using a known epitaxial growth method (for example, Metal Organic Chemical Vapor Deposition (MOCVD)) or the like (Step (a)).

Next, the first nitride semiconductor layer 103 comprising a nitride semiconductor (for example, GaN, InGaN, or AlInGaN) is formed on the buffer layer 102 (Step (b)).

Next, the second nitride semiconductor layer 104, which has a greater band gap than a band gap of the first nitride semiconductor layer 103 and comprises a nitride semiconductor including Al (for example, AlGaN or AlInGaN), is formed on the first nitride semiconductor layer 103 (Step (c)), thereby generating 2DEG as a channel on a heterojunction interface.

Next, the source electrode 105 and the drain electrode 106, each of which includes at least one of metals, such as Ti, Al, Mo, and Hf, are formed on the second nitride semiconductor layer 104 by a vacuum evaporation method or a sputtering method (Step (d)).

Next, the gate electrode 107 and the gate wiring line 110, each of which includes at least one of metals, such as Ti, Al, Ni, Pt, Pd, and Au, are formed between the source electrode 105 and the drain electrode 106 on the second nitride semiconductor layer 104 by a vacuum evaporation method or a sputtering method (Step (e)).

Through the above steps, a transistor is manufactured. It should be noted that the gate wiring line 110 is desirably formed together with the gate electrode 107 in the same step by using the same material and method, but may be formed at a different step.

In the following description, explanations of Steps (a) to (c) are omitted because these steps are shared by all the manufacturing methods below.

TABLE 2

| Method of forming channel region 108 | | | | | Method of forming non-channel region 109 | | | |
| --- | --- | --- | --- | --- | --- | --- | --- | --- |
| Embodiment 1 (FIG. 1) | Embodiment 2 (FIG. 6) | Variation 5 (FIG. 7) | Variation 6 (FIG. 8) | Variation 7 (FIG. 9) | Variation 1 (FIG. 2) | Variation 2 (FIG. 3) | Variation 3 (FIG. 4) | Variation 4 (FIG. 5) |
| Step (a) | Step (a) | Step (a) | Step (a) | Step (a) | Step (a) | Step (a) | Step (a) | Step (a) |
| Step (b) | Step (b) | Step (b) | Step (b) | Step (b) | Step (b) | Step (b) | Step (b) | Step (b) |
| Step (c) | Step (c) | Step (c) | Step (c) | Step (c) | Step (c) | Step (c) | Step (c) | Step (c) |
| Step (d) | Step (d) | Step (d) | Step (h) | Step (h) | Step (f) | Step (h) | Step (f) | Step (f) |
| Step (e) | Step (e) | Step (e) | Step (i) | Step (i) | Step (d) | Step (i) | Step (h) | Step (k) |
|  | Step (m) | Step (m) | Step (d) | Step (d) | Step (e) | Step (f) | Step (l) | Step (l) |
|  |  | Step (n) | Step (e) | Step (e) | Step (g) | Step (d) | Step (d) | Step (d) |
|  |  |  | Step (o) | Step (o) |  | Step (e) | Step (e) | Step (e) |
|  |  |  |  | Step (p) |  | Step (j) | Step (j) | Step (j) |
|  |  |  |  | Step (r) |  |  |  |  |

First, a method of manufacturing the nitride semiconductor device 1 according to Embodiment 1 is described.

Figure 10:
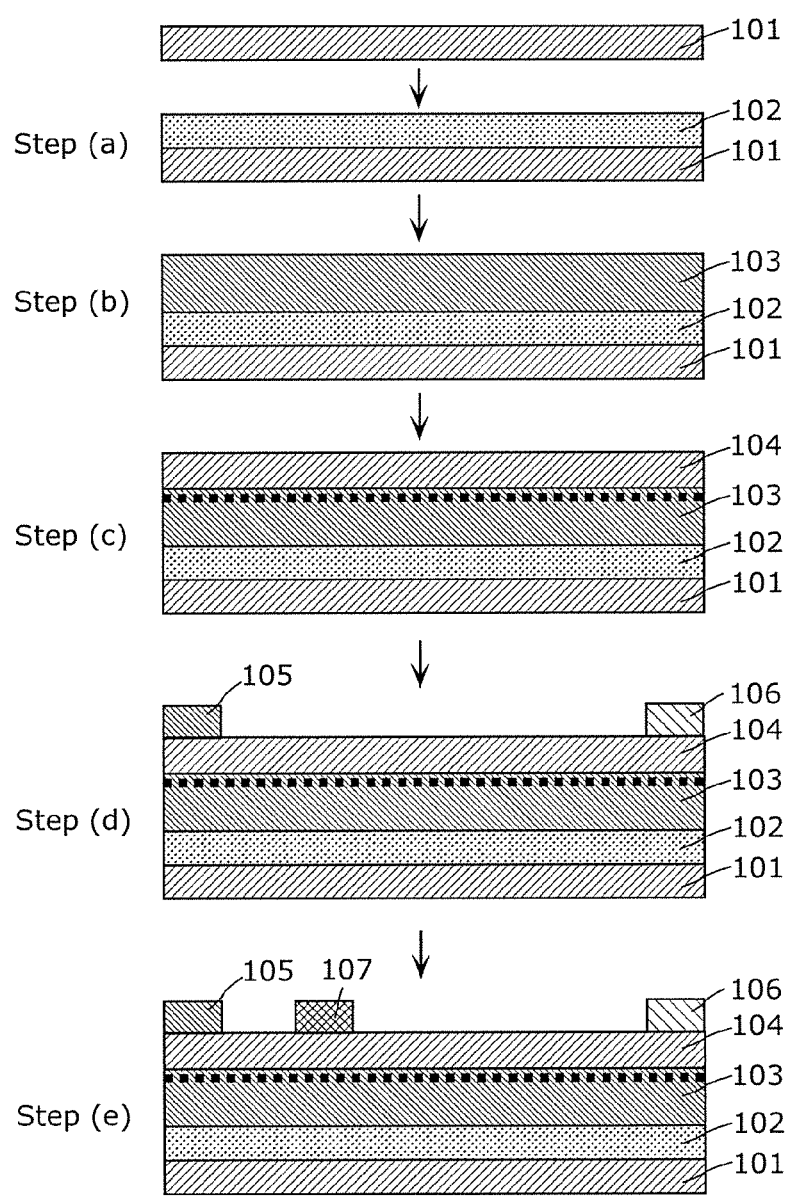
FIG. 10 illustrates a method of forming a channel region in the nitride semiconductor device according to Embodiment 1.

FIG. 10 illustrates a method of manufacturing a channel region in the nitride semiconductor device according to Embodiment 1. As illustrated in FIG. 10, first, the buffer layer 102 (for example, a buffer layer including a plurality of nitride semiconductors, such as AlN, AlGaN, GaN, InGaN, and AlInGaN) is formed on the substrate 101, which is for epitaxial growth and comprises a nitride semiconduc- Next, a method of manufacturing the nitride semiconductor device 1 according to Variation 1 of Embodiment 1 is described.

Figure 11:
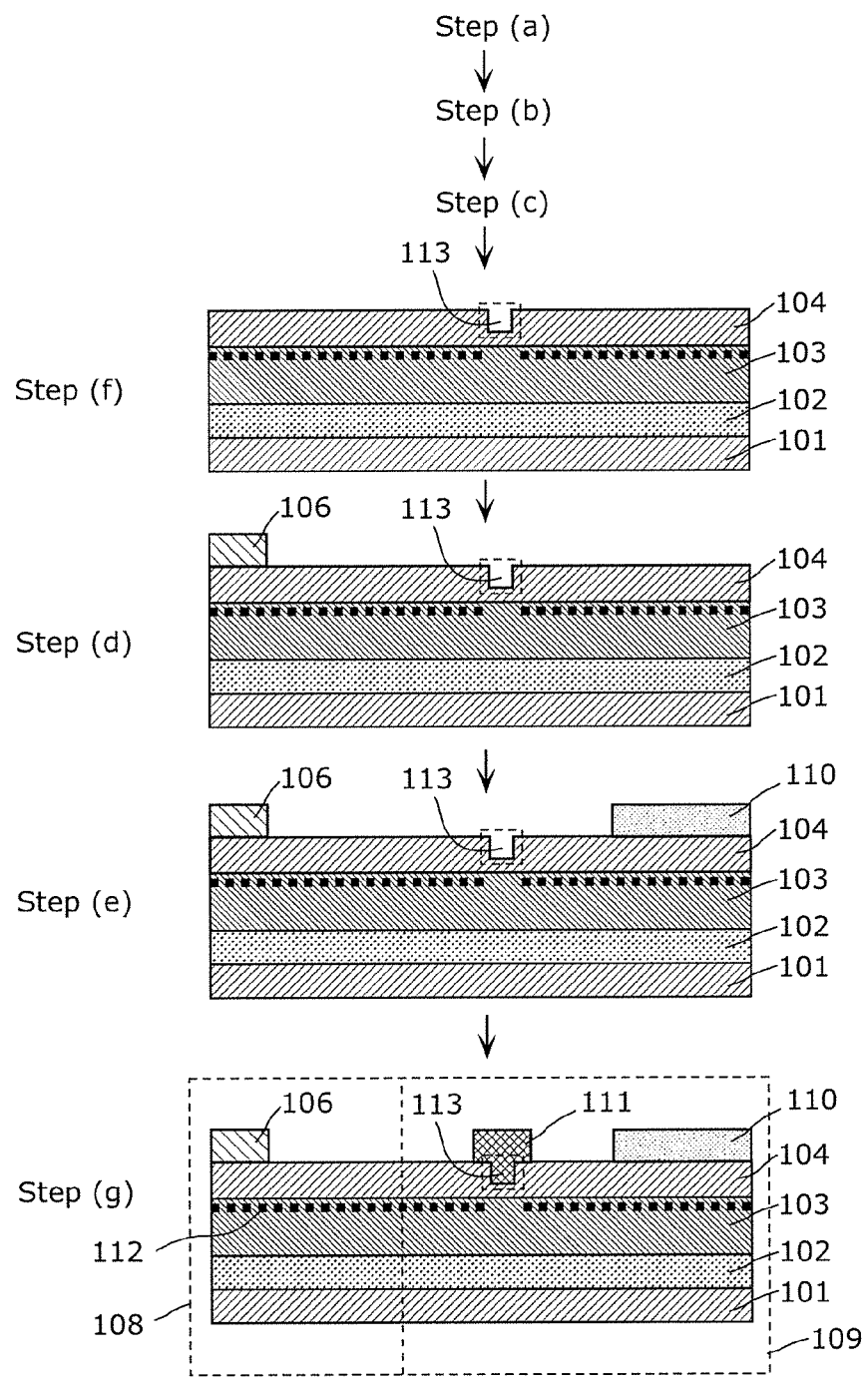
FIG. 11 illustrates a method of manufacturing the nitride semiconductor device according to Variation 1 of Embodiment 1.

FIG. 11 illustrates a method of manufacturing the nitride semiconductor device according to Variation 1 of Embodiment 1. As illustrated in FIG. 11, for the nitride semiconductor device 1 according to Variation 1, after Step (c), the recess 113 is formed by a known dry etching technique using plasma produced from $Cl_2$ gas or gas such as $BCl_3$, $O_2$, Ar, or N$_2$, (for example, Reactive Ion Etching (RIE) or Inductive Coupled Plasma Reactive Ion Etching (ICP-RIE)) (Step (f)).

Next, Step (d) is performed.

Next, Step (e) is performed.

Next, the first shield structure 111 is formed, using a metal or a semiconductor layer as material (Step (g)).

Thereby, the normally-off first shield structure 111 is formed. It should be noted that the metal or the semiconductor layer may be any material that causes a threshold voltage under the first shield structure 111 to be 0 V or higher.

Next, a method of manufacturing the nitride semiconductor device 1 according to Variation 2 of Embodiment 1 is described.

Figure 12:
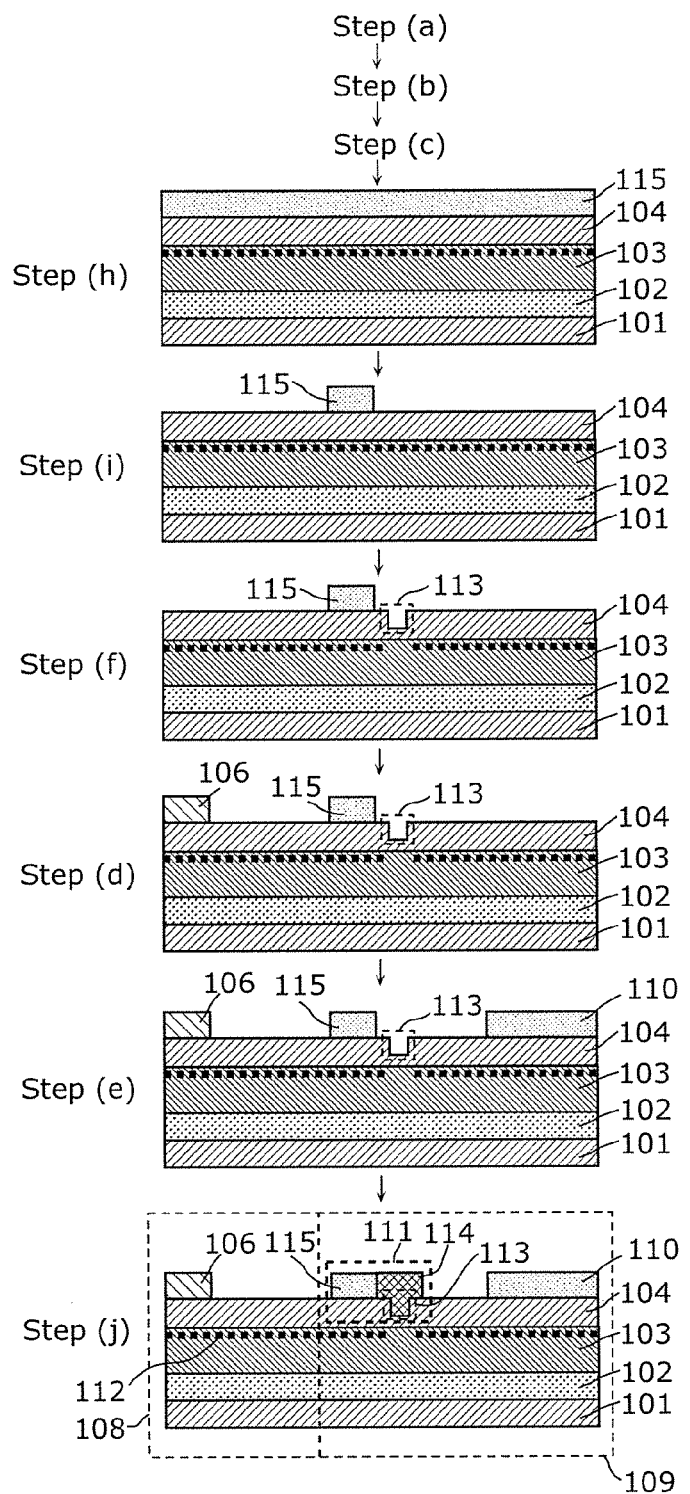
FIG. 12 illustrates a method of manufacturing the nitride semiconductor device according to Variation 2 of Embodiment 1.

FIG. 12 illustrates a method of manufacturing the nitride semiconductor device according to Variation 2 of Embodiment 1. As illustrated in FIG. 12, for the nitride semiconductor device 1 according to Variation 2, after Step (c), the p-type semiconductor layer 115 comprising, for example, GaN is formed by using again the known epitaxial growth method (for example, MOCVD) or the like (Step (h)).

Next, the p-type semiconductor layer 115 is etched by a known dry etching technique using plasma produced from Cl$_2$ gas or gas such as BCl$_3$, O$_2$, Ar, or N$_2$, (for example, RIE or ICP-RIE), thereby forming a mesa (Step (i)).

Next, Step (f) is performed.

Next, Step (d) is performed.

Next, Step (e) is performed.

Next, the first electrode 114 is formed by the same techniques as Step (d) and Step (e) (Step (j)).

Thereby, the normally-off first shield structure 111 is formed. It should be noted that, if the material of the first electrode 114 is the same as the material of the gate electrode 107 and the gate wiring line 110, the first electrode 114 may be formed together with the gate electrode 107 and the gate wiring line 110 in the same step.

Next, a method of manufacturing the nitride semiconductor device 1 according to Variation 3 of Embodiment 1 is described.

Figure 13:
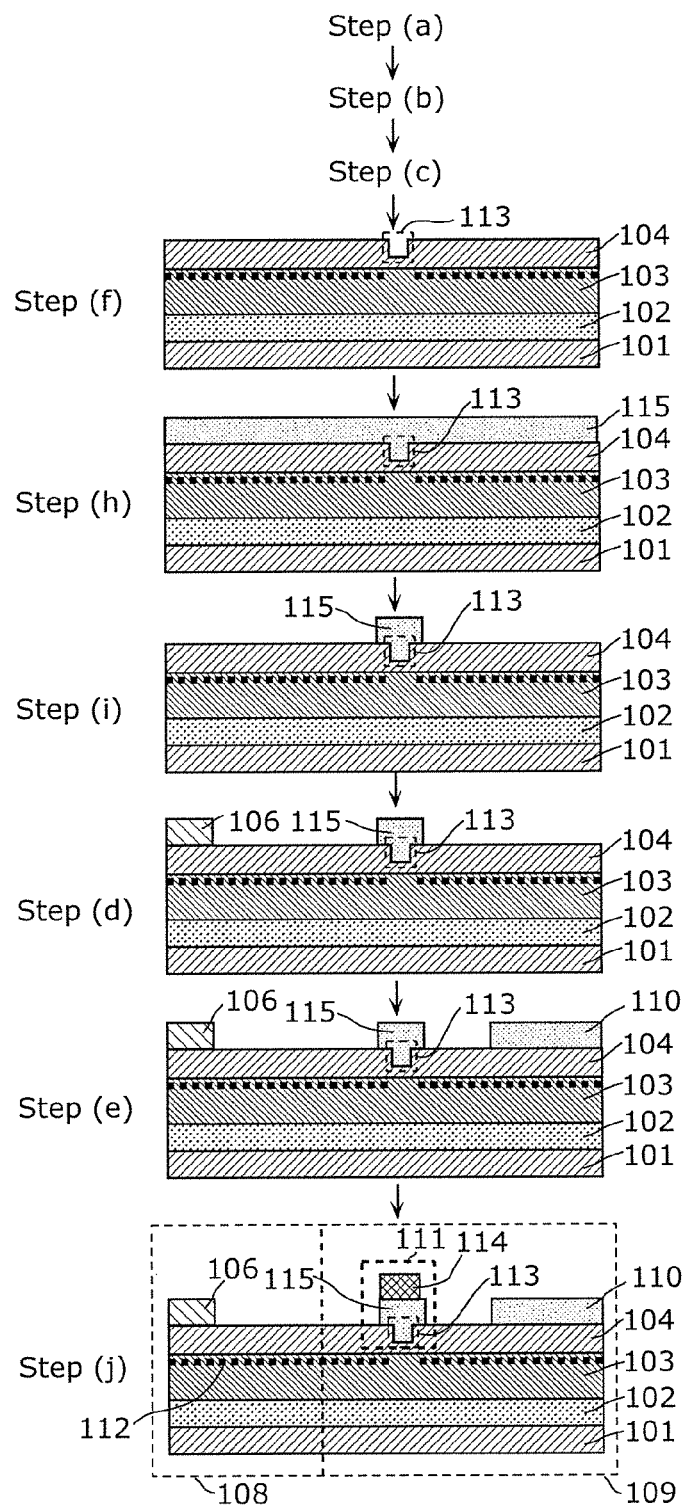
FIG. 13 illustrates a method of manufacturing the nitride semiconductor device according to Variation 3 of Embodiment 1.

FIG. 13 illustrates a method of manufacturing the nitride semiconductor device according to Variation 3 of Embodiment 1. As illustrated in FIG. 13, for the nitride semiconductor device 1 according to Variation 3, Step (f) is performed after Step (c).

Next, Step (h) is performed.

Next, Step (i) is performed.

Next, Step (d) is performed.

Next, Step (e) is performed.

Next, Step (j) is performed.

Thereby, the normally-off first shield structure 111 is formed. It should be noted that, if the material of the first electrode 114 is the same as the material of the gate electrode 107 and the gate wiring line 110, the first electrode 114 may be formed together with the gate electrode 107 and the gate wiring line 110 in the same step.

Next, a method of manufacturing the nitride semiconductor device 1 according to Variation 4 of Embodiment 1 is described.

Figure 14:
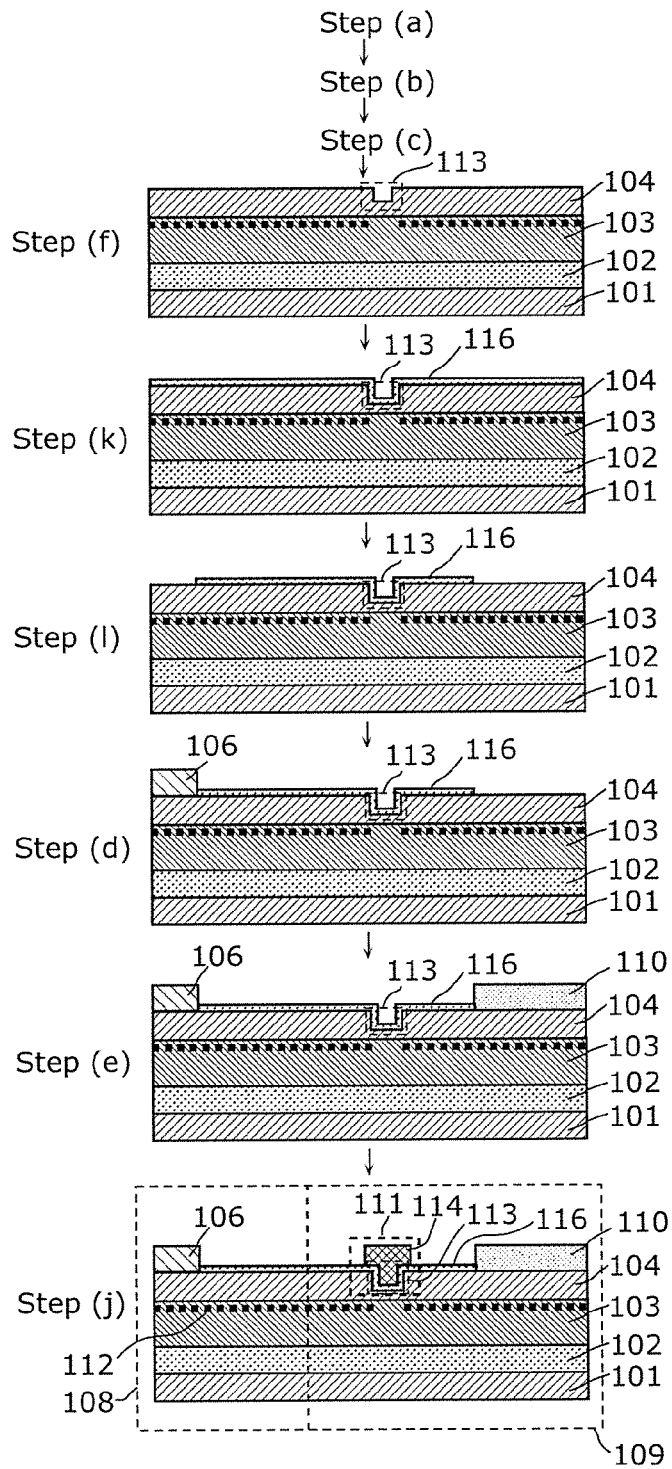
FIG. 14 illustrates a method of manufacturing the nitride semiconductor device according to Variation 4 of Embodiment 1.

FIG. 14 illustrates a method of manufacturing the nitride semiconductor device according to Variation 4 of Embodiment 1. As illustrated in FIG. 14, for the nitride semiconductor device 1 according to Variation 4, Step (f) is performed after Step (c).

Next, the insulating film 116 including, for example, at least one of SiO$_2$, Si$_3$N$_4$, AlN, Al$_2$O$_3$, Ga$_2$O$_3$, MgO, ZrO$_2$, HfO$_2$, and La$_2$O$_3$ is formed at least in the recess 113 by Chemical Vapor Deposition (CVD) or the like (Step (k)).

Next, the insulating film 116 is opened by a known dry etching technique using plasma produced from Cl$_2$ gas or gas such as BCl$_3$, O$_2$, Ar, or N$_2$, (for example, RIE or ICP-RIE) (Step (I)).

Next, Step (d) is performed.

Next, Step (e) is performed.

Next, Step (j) is performed.

Thereby, the normally-off first shield structure 111 is formed. It should be noted that, if the material of the first electrode 114 is the same as the material of the gate electrode 107 and the gate wiring line 110, the first electrode 114 may be formed together with the gate electrode 107 and the gate wiring line 110 in the same step.

Next, a method of manufacturing the nitride semiconductor device 2 according to Embodiment 2 is described.

Figure 15:
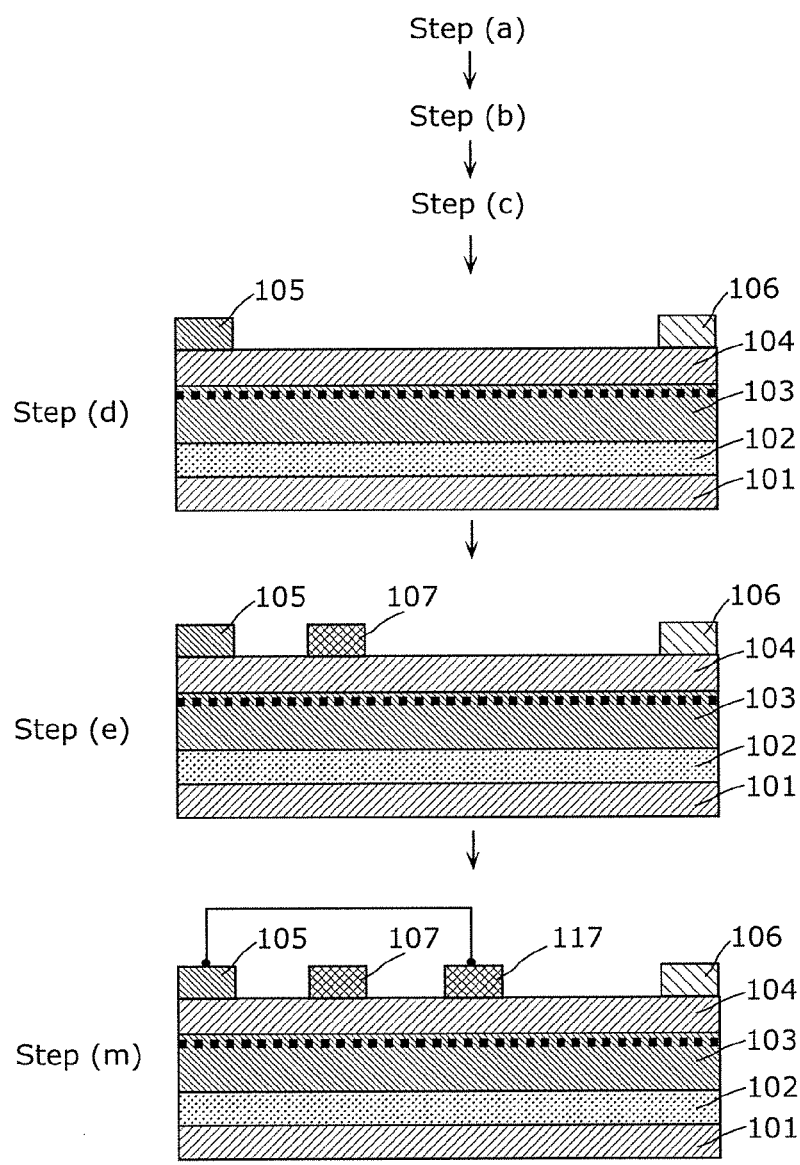
FIG. 15 illustrates a method of manufacturing the nitride semiconductor device according to Embodiment 2.

FIG. 15 illustrates a method of manufacturing the nitride semiconductor device according to Embodiment 2. As illustrated in FIG. 15, for the nitride semiconductor device 2 according to Embodiment 2, Step (d) is performed after Step (c).

Next, Step (e) is performed.

Next, the second shield structure 117 is formed, using a metal or a semiconductor layer as material (Step (m)).

Thereby, the normally-on second shield structure 117 is formed. It should be noted that the metal or the semiconductor layer may be any material that causes a threshold voltage under the second shield structure 117 to be 0 V or lower.

Furthermore, in the method of manufacturing the nitride semiconductor device having the second shield structures each comprising a nitride semiconductor according to Variation 5 of Embodiment 2, Step (n) (not illustrated) for processing the second shield structure 117 to be discontinuous can form the second shield structures. For example, the same dry etching technique as used in Step (f) or the like may be used.

Next, a method of manufacturing the nitride semiconductor device 2 according to Variation 6 according to Embodiment 2 is described.

Figure 16:
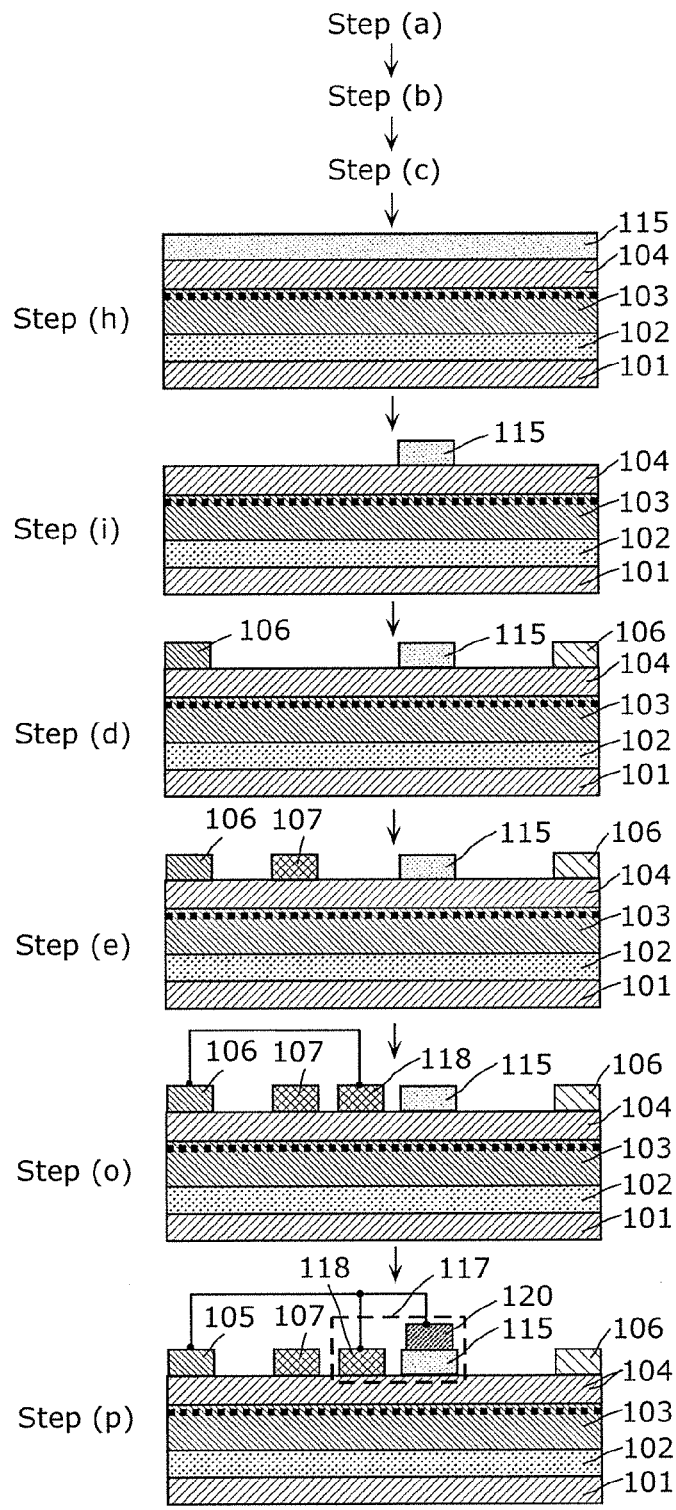
FIG. 16 illustrates a method of manufacturing the nitride semiconductor device according to Variation 6 of Embodiment 2.

FIG. 16 illustrates a method of manufacturing the nitride semiconductor device according to Variation 6 of Embodiment 2. As illustrated in FIG. 16, for the nitride semiconductor device 2 according to Variation 6, Step (h) is performed after Step (c).

Next, Step (i) is performed.

Next, Step (d) is performed.

Next, Step (e) is performed.

Next, the second electrode 118 and the third electrode 120 are formed by the same techniques as Step (d) and Step (e), respectively (Step (o) and Step (p), respectively).

Thereby, the normally-on second shield structure 117 is formed. It should be noted that, if the material of the second electrode 118 and the third electrode 120 is the same as the material of the gate electrode 107 and the gate wiring line 110, the second electrode 118 and the third electrode 120 may be formed together with the gate electrode 107 and the gate wiring line 110 in the same step.

Furthermore, in the method of manufacturing the nitride semiconductor device having the second shield structure including a nitride semiconductor according to Variation 7 of Embodiment 2, Step (i) (not illustrated) for dry-etching the p-type semiconductor layer 115 to be discontinuous, or Step (r) (not illustrated) for processing the third electrode to be discontinuous. For example, the same dry etching technique as used in Step (f) or the like may be used.

Although the nitride semiconductor device according to the present disclosure has been described based on the above embodiments and variations, the nitride semiconductor device according to the present disclosure is not limited to the embodiments and variations. Those skilled in the art will be readily appreciate that other embodiments including combinations of desired structural elements in the embodiments and variations, modifications of the embodiments and variations without materially departing from the novel teachings and advantages of the present disclosure, and various devices including the nitride semiconductor device according to the present disclosure are intended to be included within the scope of the present disclosure.

INDUSTRIAL APPLICABILITY

A nitride semiconductor device according to the present disclosure is useful as a power transistor used in inverters, power conditioners, power source circuits, and the like.

The invention claimed is:

1. A nitride semiconductor device comprising:
    a substrate;
    a semiconductor multilayer structure including a first nitride semiconductor layer and a second nitride semiconductor layer, the first nitride semiconductor layer being above the substrate, and the second nitride semiconductor layer being on the first nitride semiconductor layer and having a greater band gap than a band gap of the first nitride semiconductor layer;
    a source electrode and a drain electrode arranged at a distance from each other on the semiconductor multilayer structure;
    a gate electrode disposed between the source electrode and the drain electrode, at a distance from the source electrode and the drain electrode; and
    a gate wiring line that transmits a gate driving signal to one or more gate electrodes including the gate electrode,
    wherein the nitride semiconductor device includes in planar view of the substrate:
    a channel region in which an actual current path from the drain electrode to the source electrode is formed in the semiconductor multilayer structure when a voltage equal to or higher than a threshold voltage is applied between the gate electrode and the source electrode; and
    a non-channel region in which the actual current path from the drain electrode to the source electrode is not formed in the semiconductor multilayer structure, and
    the nitride semiconductor device further comprises
    a first shield structure on the semiconductor multilayer structure between the drain electrode and the gate electrode in the non-channel region or between the drain electrode and the gate wiring line in the non-channel region,
    wherein the first shield structure causes the semiconductor multilayer structure under the first shield structure to have normally-off properties, suppresses a current flowing from the semiconductor multilayer structure, and is set to have a substantially same potential as a potential of the source electrode.

2. The nitride semiconductor device according to claim 1, wherein the first shield structure has a rectification structure for blocking the current flowing from the semiconductor multilayer structure.

3. The nitride semiconductor device according to claim 2, wherein the first shield structure is disposed in and above a recess in the second nitride semiconductor layer.

4. The nitride semiconductor device according to claim 2, wherein the first shield structure includes:
    a first electrode disposed on the second nitride semiconductor layer; and
    a p-type semiconductor layer disposed on the second nitride semiconductor layer and being Schottky-connected to a side of the first electrode.

5. The nitride semiconductor device according to claim 2, wherein the first shield structure includes:
    a p-type semiconductor layer disposed in and above a recess in the second nitride semiconductor layer; and
    a first electrode disposed on the p-type semiconductor layer.

6. The nitride semiconductor device according to claim 1, wherein the first shield structure includes:
    an insulating film disposed in and above a recess in the second nitride semiconductor layer; and
    a first electrode disposed on the insulating film.

7. The nitride semiconductor device according to any one of claims 1, 2, and 6, further comprising
    a second shield structure on the semiconductor multilayer structure between the drain electrode and the gate electrode in the channel region,
    wherein the second shield structure causes the semiconductor multilayer structure under the second shield structure to have normally-on properties, suppresses the current flowing from the semiconductor multilayer structure, and is set to have a substantially same potential as a potential of the source electrode.

8. The nitride semiconductor device according to claim 7, wherein the second shield structure has a discontinuous shape.

9. The nitride semiconductor device according to claim 7, wherein the second shield structure includes one of three structures: (1) a first structure in which a second electrode is disposed on the second nitride semiconductor layer, (2) a second structure in which a p-type semiconductor layer is disposed on the second nitride semiconductor layer and a third electrode is disposed on the p-type semiconductor layer, and (3) a third structure in which an insulating film is disposed on the second nitride semiconductor layer and a fourth electrode is disposed on the insulating film.

10. The nitride semiconductor device according to claim 7, further comprising
    a third shield structure disposed on the semiconductor multilayer structure between the second shield structure and the drain electrode,
    wherein the third shield structure causes the semiconductor multilayer structure under the third shield structure to have normally-on properties, suppresses the current flowing from the semiconductor multilayer structure, and is set to have a substantially same potential as a potential of the source electrode, and
    the third shield structure is one of the first structure, the second structure, and the third structure, and is different from the structure of the second shield structure.

11. The nitride semiconductor device according to claim 10, wherein the third shield structure has a discontinuous shape.

* * * * *